US011054801B2

(12) United States Patent
Naohara et al.

(10) Patent No.: US 11,054,801 B2
(45) Date of Patent: Jul. 6, 2021

(54) DATA PROCESSING METHOD, DATA PROCESSING APPARATUS, DATA PROCESSING SYSTEM, AND RECORDING MEDIUM HAVING RECORDED THEREIN DATA PROCESSING PROGRAM

(71) Applicant: SCREEN Holdings Co., Ltd., Kyoto (JP)

(72) Inventors: Hideji Naohara, Kyoto (JP); Takashi Ikeuchi, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/261,739

(22) Filed: Jan. 30, 2019

(65) Prior Publication Data

US 2019/0243330 A1 Aug. 8, 2019

(30) Foreign Application Priority Data

Feb. 8, 2018 (JP) ............................ JP2018-020798

(51) Int. Cl.

| | |
|---|---|
| ***G05B 19/18*** | (2006.01) |
| ***G05B 19/406*** | (2006.01) |
| ***H01L 21/67*** | (2006.01) |
| ***G05B 19/418*** | (2006.01) |

(52) U.S. Cl.
CPC ......... *G05B 19/188* (2013.01); *G05B 19/406* (2013.01); *G05B 2219/45031* (2013.01); *H01L 21/67051* (2013.01); *H01L 21/67253* (2013.01)

(58) Field of Classification Search
CPC ................ G05B 19/188; G05B 19/406; G05B 2219/45031; G05B 19/41875; H01L 21/67051; H01L 21/67253; H01L 21/67242
See application file for complete search history.

(56) References Cited

U.S. PATENT DOCUMENTS

2002/0062162 A1 5/2002 Bunkofske et al. .......... 700/108
2005/0015176 A1* 1/2005 Harada ............ G05B 19/41865 700/121
2005/0047645 A1 3/2005 Funk et al. .................. 382/145
2006/0262628 A1 11/2006 Nii et al. ...................... 365/226
2007/0062802 A1 3/2007 Sekine et al. ................ 204/164
2008/0021677 A1* 1/2008 Buxton ............ G05B 19/41875 702/184

(Continued)

FOREIGN PATENT DOCUMENTS

JP 2009-235833 A 10/2009
JP 2017-083985 A 5/2017

(Continued)

*Primary Examiner* — Thomas C Lee
*Assistant Examiner* — Anzuman Sharmin
(74) *Attorney, Agent, or Firm* — Ostrolenk Faber LLP

(57) ABSTRACT

A data processing method for processing a plurality of pieces of unit-processing data includes: a reference data changing step of changing reference data (data that is selected from a plurality of pieces of unit-processing data for each unit-element, and to be compared with each piece of unit-processing data); and a reference data extending step of extending new reference data which is the reference data after change by the reference data changing step to a unit-element other than a unit-element for which the reference data has been changed.

12 Claims, 26 Drawing Sheets

(56) References Cited

U.S. PATENT DOCUMENTS

| | | | | |
|---|---|---|---|---|
| 2008/0097640 | A1* | 4/2008 | Cho | G05B 19/042 700/121 |
| 2009/0125276 | A1 | 5/2009 | Koizumi | 702/182 |
| 2009/0276076 | A1 | 11/2009 | Takahashi et al. | 700/110 |
| 2011/0035188 | A1 | 2/2011 | Martinez-Heras et al. | 702/189 |
| 2011/0172800 | A1 | 7/2011 | Koizumi et al. | 700/100 |
| 2012/0242667 | A1* | 9/2012 | Kaushal | G05B 23/0237 345/440 |
| 2012/0253724 | A1 | 10/2012 | Asai et al. | 702/88 |
| 2015/0012777 | A1 | 1/2015 | Suzuki et al. | 714/15 |
| 2015/0198947 | A1 | 7/2015 | Sugiyama et al. | |
| 2015/0253762 | A1 | 9/2015 | Nakano et al. | |
| 2015/0262550 | A1 | 9/2015 | Kawaguchi | |
| 2016/0078163 | A1* | 3/2016 | Koshimaki | G06F 30/30 716/139 |
| 2016/0155611 | A1* | 6/2016 | Kagoshima | C23C 16/52 156/345.24 |
| 2016/0225681 | A1 | 8/2016 | Asakura et al. | |
| 2017/0116319 | A1 | 4/2017 | Zhou | |

FOREIGN PATENT DOCUMENTS

| | | | |
|---|---|---|---|
| KR | 10-2014-0012144 | A | 1/2014 |
| TW | 201346531 | A | 11/2013 |
| TW | I515725 | B | 1/2016 |
| TW | I607436 | B | 12/2017 |

* cited by examiner

SCORING

| | | | |
|---|---|---|---|
| Chamber3 total 100 | Chamber6 total 80 | Chamber9 total 100 | Chamber12 total 100 (50) — 34 |
| Chamber2 total 100 | Chamber5 total 80 | Chamber8 total 80 | Chamber11 total 100 |
| Chamber1 total 100 | Chamber4 total 100 (10) — 34 | Chamber7 total 150 | Chamber10 total 150 |

30

40

SCORING RESULT LIST

411 — Good | 412 — Bad | 413 — Ranking [2][1][3] | 414 — Swap

Unit: Chamber3  Process Recipe: Flushing test2

| Failed/Total | Start Time | End Time | Process Time | Alarm | Substrate ID | Recommend (Good/Bad) |
|---|---|---|---|---|---|---|
| 0/34 | 08/16/2017 03:09:24 PM | 08/16/2017 03:15:26 PM | 0:06:02 | None | 007.02 | 0/0 |
| 2/34 | 08/15/2017 03:35:34 PM | 08/15/2017 03:41:37 PM | 0:06:03 | None | 035.02 | 0/0 |
| 0/34 | 08/15/2017 03:01:59 PM | 08/15/2017 03:08:01 PM | 0:06:02 | None | 029.02 | 2/0 |
| 0/34 | 08/15/2017 02:39:55 PM | 08/15/2017 02:45:57 PM | 0:06:02 | None | 025.02 | 0/0 |
| 0/34 | 08/15/2017 02:08:10 PM | 08/15/2017 02:14:12 PM | 0:06:02 | None | 019.25 | 0/0 |
| 3/34 | 08/15/2017 01:53:32 PM | 08/15/2017 01:59:34 PM | 0:06:02 | 2 | 016.25 | 0/1 |
| 0/34 | 07/31/2017 08:26:01 AM | 07/31/2017 08:32:03 AM | 0:06:02 | None | 257.02 | 0/0 |
| 32/34 | 07/26/2017 01:21:16 PM | 07/26/2017 01:27:16 PM | 0:06:01 | None | 049.02 | 0/0 |

07/19/2017 07:39:34 PM To 8/19/2017 07:39:34 PM

40

SCORING RESULT LIST

411 [Good] 412 [Bad] 413 [Ranking 1 2 3] 414 [Swap]

Unit: Chamber3  Process Recipe: Flushing test2

| Failed/Total | Start Time | End Time | Process Time | Alarm | Substrate ID | Recommend (Good/Bad) |
|---|---|---|---|---|---|---|
| 0/34 | 08/16/2017 03:09:24 PM | 08/16/2017 03:15:26 PM | 0:06:02 | None | 007.02 | 0/0 |
| 2/34 | 08/15/2017 03:35:34 PM | 08/15/2017 03:41:37 PM | 0:06:03 | None | 035.02 | 0/0 |
| 0/34 | 08/15/2017 03:01:59 PM | 08/15/2017 03:08:01 PM | 0:06:02 | None | 029.02 | 2/0 |
| 0/34 | 08/15/2017 02:39:55 PM | 08/15/2017 02:45:57 PM | 0:06:02 | None | 025.02 | 0/0 |
| 0/34 | 08/15/2017 02:08:10 PM | 08/15/2017 02:14:12 PM | 0:06:02 | None | 019.25 | 0/0 |
| 3/34 | 08/15/2017 01:53:32 PM | 08/15/2017 01:59:34 PM | 0:06:02 | 2 | 016.25 | 0/1 |
| 0/34 | 07/31/2017 08:26:01 AM | 07/31/2017 08:32:03 AM | 0:06:02 | None | 257.02 | 0/0 |
| 32/34 | 07/26/2017 01:21:16 PM | 07/26/2017 01:27:16 PM | 0:06:01 | None | 049.02 | 0/0 |

07/19/2017 07:39:34 PM To 8/19/2017 07:39:34 PM

SCORING RESULT LIST

411 — Good / 412 — Bad / 413 — Ranking [2 1 / 3] / 414 — Swap

Unit: Chamber3   Process Recipe: Flushing test2

| Failed/Total | Start Time | End Time | Process Time | Alarm | Substrate ID | Recommend (Good/Bad) |
|---|---|---|---|---|---|---|
| 0/34 | 08/16/2017 03:09:24 PM | 08/16/2017 03:15:26 PM | 0:06:02 | None | 007.02 | 0/0 |
| 2/34 | 08/15/2017 03:35:34 PM | 08/15/2017 03:41:37 PM | 0:06:03 | None | 035.02 | 0/0 |
| 0/34 | 08/15/2017 03:01:59 PM | 08/15/2017 03:08:01 PM | 0:06:02 | None | 029.02 | 2/0 |
| 0/34 | 08/15/2017 02:39:55 PM | 08/15/2017 02:45:57 PM | 0:06:02 | None | 025.02 | 0/0 |
| 0/34 | 08/15/2017 02:08:10 PM | 08/15/2017 02:14:12 PM | 0:06:02 | None | 019.25 | 0/0 |
| 3/34 | 08/15/2017 01:53:32 PM | 08/15/2017 01:59:34 PM | 0:06:02 | 2 | 016.25 | 0/1 |
| 0/34 | 07/31/2017 08:26:01 AM | 07/31/2017 08:32:03 AM | 0:06:02 | None | 257.02 | 0/0 |
| 32/34 | 07/26/2017 01:21:16 PM | 07/26/2017 01:27:16 PM | 0:06:01 | None | 049.02 | 0/3 |

RANKING

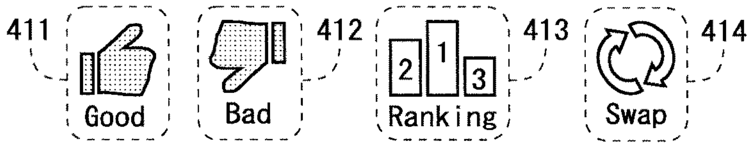

61

Unit:Chamber3, Chamber4, Chamber5 Process Recipe:Flushing test2

62

| Ranking | Total Score | Recommend Score | Scoring Result Score | Alarm Number Score | Unit | Start Time | End Time | Process Time |
|---|---|---|---|---|---|---|---|---|
| 1 | 93 | 45 | 28 | 20 | Chamber3 | 08/16/2017 03:09:24 PM | 08/16/2017 03:15:26 PM | 0:06:02 |
| 2 | 88 | 40 | 28 | 20 | Chamber3 | 08/15/2017 03:35:34 PM | 08/15/2017 03:41:37 PM | 0:06:03 |
| 3 | 80 | 32 | 28 | 20 | Chamber3 | 08/15/2017 03:01:59 PM | 08/15/2017 03:08:01 PM | 0:06:02 |
| 4 | 73 | 38 | 15 | 20 | Chamber4 | 08/15/2017 02:39:55 PM | 08/15/2017 02:45:57 PM | 0:06:02 |
| 5 | 66 | 36 | 10 | 20 | Chamber5 | 08/15/2017 02:08:10 PM | 08/15/2017 02:14:12 PM | 0:06:02 |
| 6 | 65 | 35 | 10 | 20 | Chamber3 | 08/15/2017 01:53:32 PM | 08/15/2017 01:59:34 PM | 0:06:02 |
| 7 | 63 | 25 | 18 | 20 | Chamber4 | 07/31/2017 08:26:01 AM | 07/31/2017 08:32:03 AM | 0:06:02 |
| 8 | 60 | 36 | 4 | 20 | Chamber3 | 08/15/2017 02:39:55 PM | 08/15/2017 02:45:57 PM | 0:06:02 |
| 9 | 59 | 36 | 3 | 20 | Chamber4 | 08/15/2017 02:08:10 PM | 08/15/2017 02:14:12 PM | 0:06:02 |
| 10 | 57 | 28 | 9 | 20 | Chamber4 | 08/15/2017 01:53:32 PM | 08/15/2017 01:59:34 PM | 0:06:02 |
| 11 | 45 | 26 | 19 | −20 | Chamber4 | 08/14/2017 02:08:20 PM | 08/14/2017 02:14:21 PM | 0:06:01 |

63

64

07/19/2017 07:39:34 PM To 8/19/2017 07:39:34 PM

65

| Ranking | Total Score | Recommend Score | Scoring Result Score | Alarm Number Score | Unit | Start Time | End Time | Process Time |
|---|---|---|---|---|---|---|---|---|
| 1 | 93 | 45 | 28 | 20 | Chamber3 | 08/16/2017 03:09:24 PM | 08/16/2017 03:15:26 PM | 0:06:02 |
| 2 | 88 | 40 | 28 | 20 | Chamber3 | 08/15/2017 03:35:34 PM | 08/15/2017 03:41:37 PM | 0:06:03 |
| 3 | 80 | 32 | 28 | 20 | Chamber3 | 08/15/2017 03:01:59 PM | 08/15/2017 03:08:01 PM | 0:06:02 |
| 4 | 73 | 38 | 15 | 20 | Chamber4 | 08/15/2017 02:39:55 PM | 08/15/2017 02:45:57 PM | 0:06:02 |
| 5 | 66 | 36 | 10 | 20 | Chamber5 | 08/15/2017 02:08:10 PM | 08/15/2017 02:14:12 PM | 0:06:02 |
| 6 | 65 | 35 | 10 | 20 | Chamber3 | 08/15/2017 01:53:32 PM | 08/15/2017 01:59:34 PM | 0:06:02 |
| 7 | 63 | 25 | 18 | 20 | Chamber4 | 07/31/2017 08:26:01 AM | 07/31/2017 08:32:03 AM | 0:06:02 |
| 8 | 60 | 36 | 4 | 20 | Chamber3 | 08/15/2017 02:39:55 PM | 08/15/2017 02:45:57 PM | 0:06:02 |
| 9 | 59 | 36 | 3 | 20 | Chamber4 | 08/15/2017 02:08:10 PM | 08/15/2017 02:14:12 PM | 0:06:02 |
| 10 | 57 | 28 | 9 | 20 | Chamber4 | 08/15/2017 01:53:32 PM | 08/15/2017 01:59:34 PM | 0:06:02 |
| 11 | 45 | 26 | 19 | −20 | Chamber4 | 08/14/2017 02:08:20 PM | 08/14/2017 02:14:21 PM | 0:06:01 |

800

| REFERENCE DATA SELECTION | | | |
|---|---|---|---|
| Serial Number | Unit | Process Recipe | |
| A1230001 | Chamber1 | Flushing test1 | |
| A1230001 | Chamber2 | Flushing test2 | |
| A1230055 | Chamber8 | Flushing test3 | |
| A1230055 | Chamber7 | Flushing test4 | |
| ⋮ | ⋮ | ⋮ | |

801 — header row
802 — data rows

Download — 803

810

EXTENSION DESTINATION SELECTION

Serial Number
- A1230001
- A1230055
- ⋮

811

Unit
- Chamber1
- Chamber2
- Chamber3
- Chamber4
- ⋮

812

818 — OK     Cancel — 819

DATA PROCESSING METHOD, DATA PROCESSING APPARATUS, DATA PROCESSING SYSTEM, AND RECORDING MEDIUM HAVING RECORDED THEREIN DATA PROCESSING PROGRAM

BACKGROUND OF THE INVENTION

Field of the Invention

The present invention relates to digital data processing, and particularly relates to a method for processing time series data.

Description of Related Art

As a method for detecting an abnormality of equipment or an apparatus, there is known a method of measuring a physical quantity (e.g., length, angle, time, speed, force, pressure, voltage, current, temperature, flow rate, etc.) which shows an operation state of the equipment or the apparatus by use of a sensor or the like, and analyzing time series data obtained by arranging measurement results in order of occurrence. When the equipment or the apparatus performs the same operation in the same condition, if there is no abnormality, the time series data changes in the same way. Therefore, by comparing a plurality of pieces of time series data which change in the same way to each other to detect abnormal time series data and analyzing the abnormal time series data, it is possible to specify a place where the abnormality occurs and the cause of the abnormality. Also, in recent years, computer data processing capability has been improved remarkably. There have thus been many cases where, even when an amount of data is enormous, necessary results can be obtained in practical time. This also shows that the analysis of time series data is becoming active.

For example, in a semiconductor manufacturing apparatus, time series data can be obtained in various processes. Therefore, also in the field of the semiconductor manufacturing apparatus, analysis of time series data, display of time series data on a screen, and the like, have been performed.

In connection with the present invention, Japanese Laid-Open Patent Publication No. 2017-83985 discloses an invention of a time series data processing apparatus that displays time series data in a mode easy for the user to analyze. In the time series data processing apparatus, a plurality of pieces of time series data are divided into a plurality of groups, and an abnormality degree of each group and an abnormality degree of time series data within each group are calculated. Then, a result of ranking the groups or the pieces of time series data based on the abnormality degrees is displayed on a display.

A substrate processing apparatus such as a cleaning apparatus, which is one type of the semiconductor manufacturing apparatus, generally includes a plurality of chambers (processing chambers). When the same recipe is executed in the plurality of chambers, uniform results are preferably obtained in the plurality of chambers. Hence a plurality of chambers included in one substrate processing apparatus preferably have similar processing performance. However, in reality, a difference in processing performance occurs among a plurality of chambers. For this reason, when processing is being normally performed on a substrate in a certain chamber, similar processing may not be being normally performed in another chamber.

In view of this, also in the field of substrate processing apparatuses, analysis of time series data obtained by various processes is being performed in order to achieve early detection of abnormality and prevention of abnormality. Meanwhile, in order to determine whether or not each piece of time series data included in a plurality of pieces of time series data changing in the same manner is abnormal, each piece of time series data to be evaluated is compared with time series data having ideal time-series values (data values). As time series data having the ideal time series values, for example, it is conceivable to use time series data made up of average values of a plurality of pieces of time series data. However, in a case where the plurality of pieces of time series data on which an average value is calculated include a large number of pieces of data having abnormal values or having significantly different values from the other values, a calculated average value is not necessarily an ideal value, and an abnormality thus cannot be detected accurately.

SUMMARY OF THE INVENTION

An object of the present invention is therefore to provide a data processing method capable of performing abnormality detection using time series data more accurately than before.

One aspect of the present invention is directed to a data processing method for processing a plurality of pieces of unit-processing data by regarding a plurality of pieces of time series data obtained by unit-processing as unit-processing data, the method including:

a reference data changing step of changing reference data which is data selected from a plurality of pieces of unit-processing data for each unit-element and is data to be compared with each piece of unit-processing data; and a reference data extending step of extending new reference data which is the reference data after change by the reference data changing step to a unit-element other than the unit-element for which the reference data has been changed in the reference data changing step.

With such a configuration, when there is a change in reference data (data selected from a plurality of pieces of unit-processing data for each unit-element, and data to be compared with each piece of unit-processing data) for a certain unit-element, new reference data which is reference data after change can be extended to the other unit-element. Thus, also for a unit-element for which unit-processing data with a favorable result has not been obtained, it is possible to hold unit-processing data with a favorable result as reference data. In this manner, unit-processing data obtained by processing in each unit-element can be compared with suitable reference data, so that an abnormality of processing can be detected accurately. As described above, it is possible to perform the abnormality detection using time series data more accurately than before.

Another aspect of the present invention is directed to a data processing method in a data processing system including a plurality of unit-elements, for processing a plurality of pieces of unit-processing data by regarding a plurality of pieces of time series data obtained by unit-processing as unit-processing data, wherein the data processing system includes

- a first reference data storage part that is provided for each unit-element and stores reference data which is data selected from a plurality of pieces of unit-processing data for each unit-element and is data to be compared with each piece of unit-processing data,
- a second reference data storage part that is shared by all unit-elements and stores the reference data, and an extension management part for managing extension of the reference data, and the method includes a configuration information transmitting step of transmitting, when a unit-element is newly added, a configuration information for a new unit-element that is an newly added unit-element from the new unit-element to the extension management part, a reference data acquiring step of acquiring the reference data to be extended to the new unit-element from the second reference data storage part based on the configuration information, in the extension management part, a reference data transmitting step of transmitting the reference data obtained in the reference data acquiring step from the extension management part to the new unit-element, and a reference data storing step of storing the reference data transmitted in the reference data transmitting step in the first reference data storage part, in the new unit-element.

With such a configuration, when a unit-element is added to the data processing system, a configuration information for the new unit-element is transmitted to the extension management part, and the reference data based on the configuration information is extended to the new unit-element. Accordingly, also for the new unit-element that is added to the data processing system, it is possible to hold unit-processing data of a favorable result as reference data. In this manner, unit-processing data obtained by processing in the new unit-element can be compared with suitable reference data, so that an abnormality of processing executed in the new unit-element can be detected accurately. As described above, it is possible to perform the abnormality detection using time series data more accurately than before.

Still another aspect of the present invention is directed to a data processing apparatus for processing a plurality of pieces of unit-processing data by regarding a plurality of pieces of time series data obtained by unit-processing as unit-processing data, the apparatus including:

a reference data storage part that is provided for each unit-element and stores reference data which is data selected from a plurality of pieces of unit-processing data for each unit-element and is data to be compared with each piece of unit-processing data; and a reference data extension part configured to extend reference data, which is stored in the reference data storage part for one unit-element, to the other unit-element.

Still another aspect of the present invention is directed to a data processing system for processing a plurality of pieces of unit-processing data by regarding a plurality of pieces of time series data obtained by unit-processing as unit-processing data, the system including:

a reference data storage part that is provided for each unit-element and stores reference data which is data selected from a plurality of pieces of unit-processing data for each unit-element and is data to be compared with each piece of unit-processing data; and a reference data extension part configured to extend reference data, which is stored in the reference data storage part for one unit-element, to the other unit-element.

Still another aspect of the present invention is directed to a computer-readable recording medium having recorded therein a data processing program for processing a plurality of pieces of unit-processing data by regarding a plurality of pieces of time series data obtained by unit-processing as unit-processing data, wherein the data processing program causes a computer to execute:

a reference data changing step of changing reference data which is data selected from a plurality of pieces of unit-processing data for each unit-element and is data to be compared with each piece of unit-processing data; and a reference data extending step of extending new reference data which is the reference data after change by the reference data changing step to a unit-element other than the unit-element for which the reference data has been changed in the reference data changing step.

These and other objects, features, modes, and advantages of the present invention will become more apparent from the following detailed description of the present invention with reference to the accompanying drawings.

BRIEF DESCRIPTION OF THE DRAWINGS

FIG. 15 is a view showing an example of the ranking screen in the first embodiment.

DETAILED DESCRIPTION OF PREFERRED EMBODIMENTS

Preferred embodiments of the present invention will be described below with reference to the drawings.

1. First Embodiment

<1.1 Configuration of Substrate Processing Apparatus>

Figure 1:
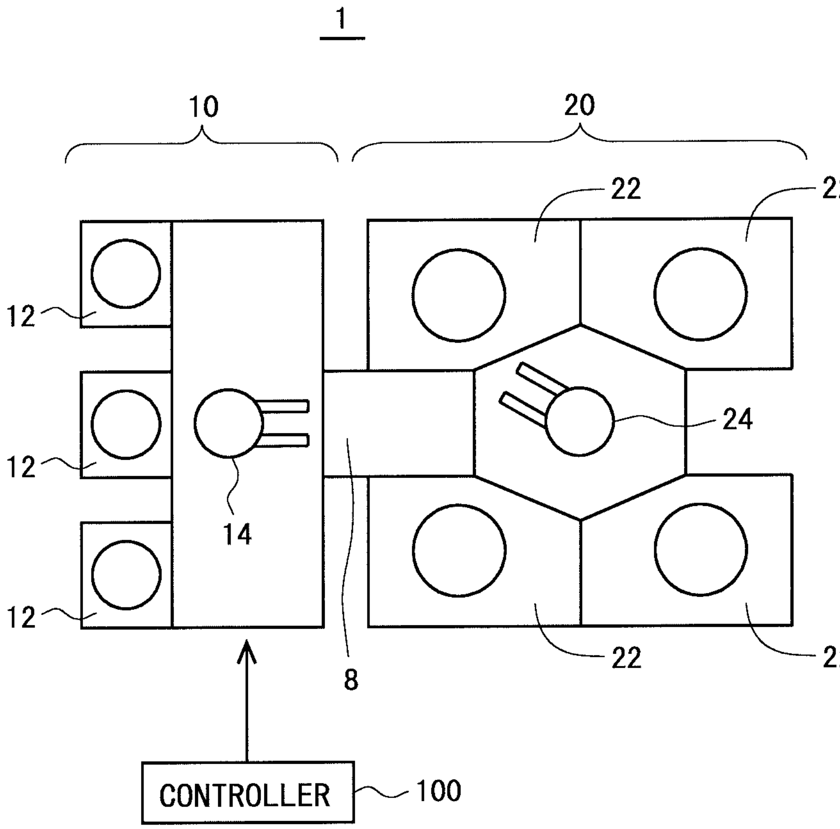
FIG. 1 is a diagram showing a schematic configuration of a substrate processing apparatus according to a first embodiment of the present invention.

FIG. 1 is a diagram showing a schematic configuration of a substrate processing apparatus 1 according to a first embodiment of the present invention. The substrate processing apparatus 1 includes an indexer part 10 and a processing part 20. The indexer part 10 includes a plurality of substrate container holding parts 12 for placing a substrate container (cassette) capable of accommodating a plurality of substrates, and an indexer robot 14 for carrying a substrate out of the substrate container and carrying a substrate into the substrate container. The processing part 20 includes a plurality of processing units 22 for performing processing such as cleaning of substrates using a processing liquid, and a substrate transfer robot 24 for carrying a substrate into the processing unit 22 and carrying a substrate out of the processing unit 22. The number of processing units 22 is, for example, 12. In this case, for example, a tower structure formed by laminating three processing units 22 is provided at each of four positions around the substrate transfer robot 24 as shown in FIG. 1. Also, in the following description, it is assumed that 12 processing units 22 are provided, and it is assumed that 12 processing units 22 are distinguished by names "Chamber1" to "Chamber12." Each processing unit 22 is provided with a chamber that is a space for processing the substrate, and the processing liquid is supplied to the substrate in the chamber. Further, the substrate processing apparatus 1 is internally provided with a controller 100 constituted of a microcomputer.

When processing is performed on the substrate, the indexer robot 14 takes the substrate to be processed out of the substrate container placed on the substrate container holding part 12 and transfers the substrate to the substrate transfer robot 24 via a substrate transfer part 8. The substrate transfer robot 24 carries the substrate received from the indexer robot 14 into the target processing unit 22. When the processing on the substrate is completed, the substrate transfer robot 24 takes the substrate out of the target processing unit 22 and transfers the substrate to the indexer robot 14 via the substrate transfer part 8. The indexer robot 14 carries the substrate received from the substrate transfer robot 24 to a target substrate container.

The controller 100 controls operation of an object to be controlled (such as a moving mechanism for moving the indexer robot 14) included in the indexer part 10 and the processing part 20. In addition, the controller 100 accumulates and holds time series data obtained by executing a recipe in this substrate processing apparatus 1, and performs various pieces of data processing using the time series data.

<1.2 Time Series Data and Reference Data>

In the substrate processing apparatus 1 according to the present embodiment, time series data is acquired every time a recipe is executed in order to detect abnormality of equipment relating to processing in each processing unit 22, abnormality of processing performed in each processing unit 22, and the like. The time series data acquired in the present embodiment is obtained by measuring various physical quantities (e.g., a flow rate of a nozzle, an internal pressure of a chamber, an exhaust pressure of a chamber, etc.) using a sensor or the like when a recipe is executed, and arranging measurement results in chronological order. In a data processing program to be described later, various physical quantities are processed as values of corresponding parameters, respectively. Note that one parameter corresponds to one type of physical quantity.

Figure 2:
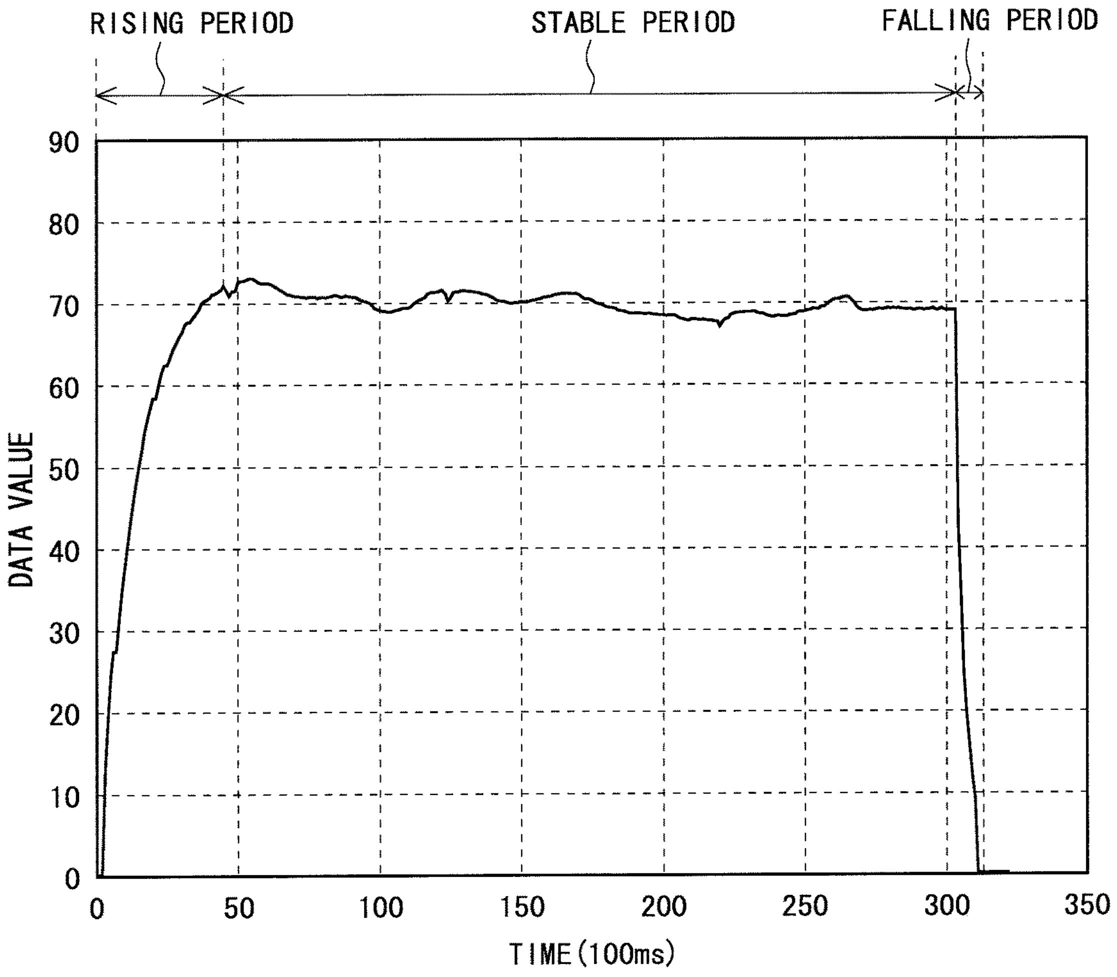
FIG. 2 is a diagram representing a certain time series data by a graph.
Figure 3:
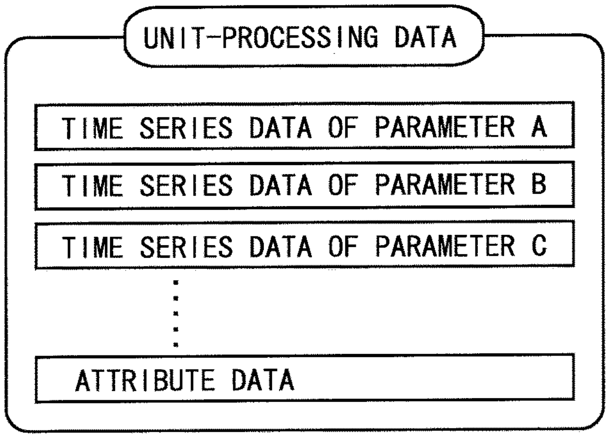
FIG. 3 is a diagram for explaining unit-processing data in the first embodiment.

FIG. 2 is a diagram representing a certain time series data by a graph. This time series data is data on a certain physical quantity obtained by processing on one substrate in a chamber in one processing unit 22 when one recipe is executed. Note that, although the time series data is data made up of a plurality of discrete values, two temporally adjacent data values are connected by a straight line in FIG. 2. Meanwhile, when one recipe is executed, time series data on various physical quantities are obtained for each processing unit 22 in which the recipe is executed. Therefore, hereinafter, processing which is performed on one substrate in the chamber in one processing unit 22 when one recipe is executed is referred to as "unit-processing", and a group of time series data obtained by the unit-processing is called "unit-processing data." As schematically shown in FIG. 3, one piece of unit-processing data includes time series data on a plurality of parameters and attribute data made up of data on a plurality of items (e.g., processing start time, processing end time, etc.) for specifying the piece of unit-processing data. As for FIG. 3, "parameter A", "parameter B", and "parameter C" correspond to different kinds of physical quantities.

For detecting an abnormality in equipment or processing, unit-processing data obtained by executing a recipe should be compared with unit-processing data having an ideal data value as a processing result. More specifically, a plurality of pieces of time series data included in unit-processing data obtained by executing a recipe should be compared with a plurality of pieces of time series data included in unit-processing data each having an ideal data value as a processing result. Therefore, in the present embodiment, unit-processing data for comparison with unit-processing data to be evaluated (unit-processing data made up of a plurality of pieces of time series data for comparison with a plurality of pieces of time series data included in the unit-processing data to be evaluated) is defined as reference data for each processing unit 22 and for each recipe. That is, focusing on one recipe, definition as the reference data corresponding to the recipe is made for each processing unit 22.

<1.3 Configuration of Controller>

Figure 4:
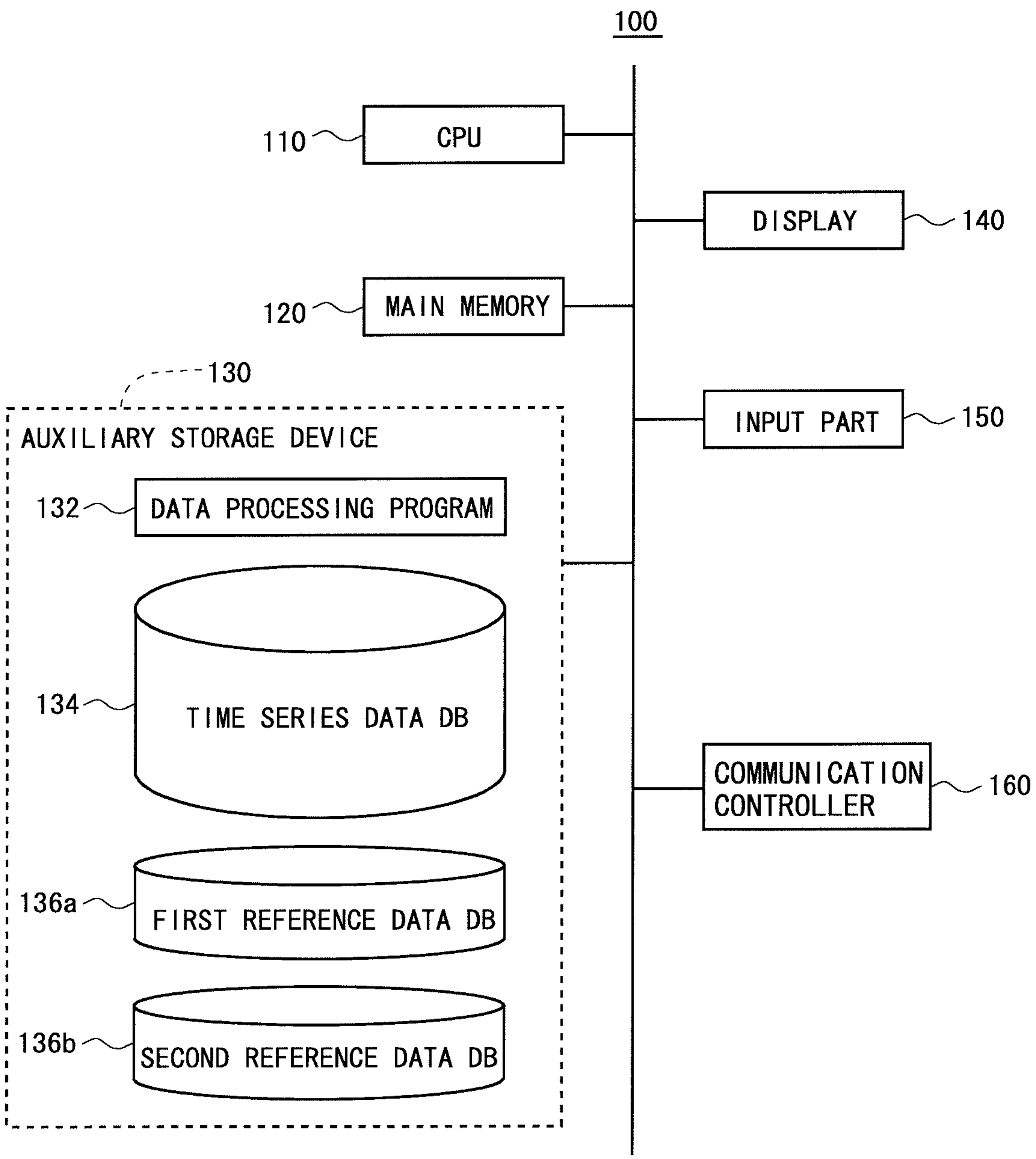
FIG. 4 is a block diagram showing a hardware configuration of a controller of the substrate processing apparatus in the first embodiment.
Figure 5:
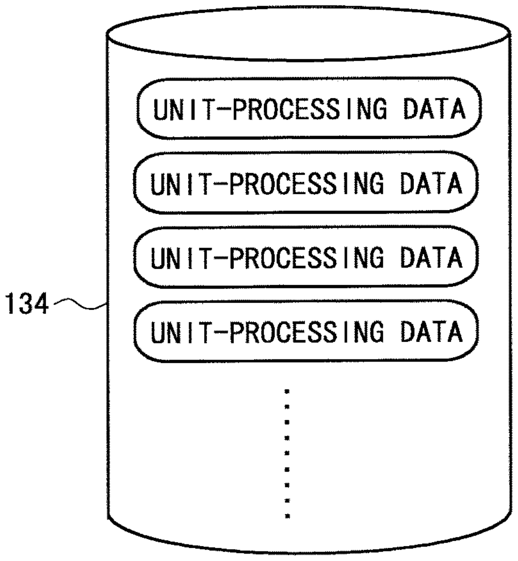
FIG. 5 is a diagram for explaining time series data DB in the first embodiment.
Figure 6:
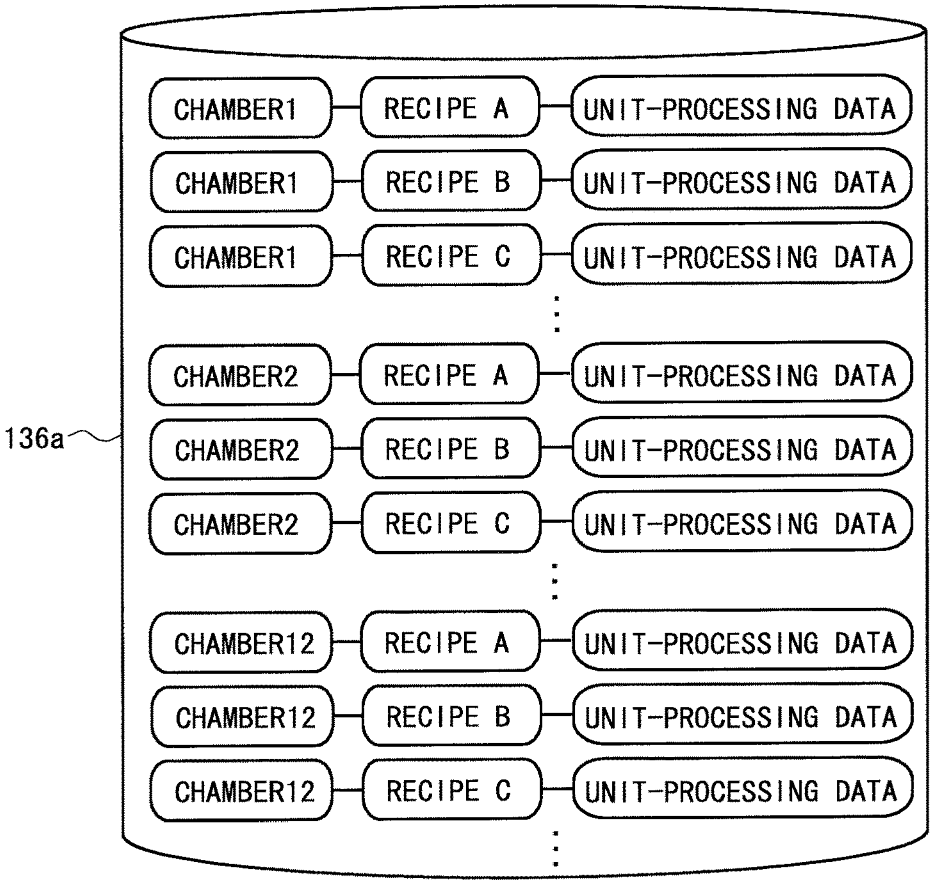
FIG. 6 is a diagram for explaining first reference data DB in the first embodiment.
Figure 7:
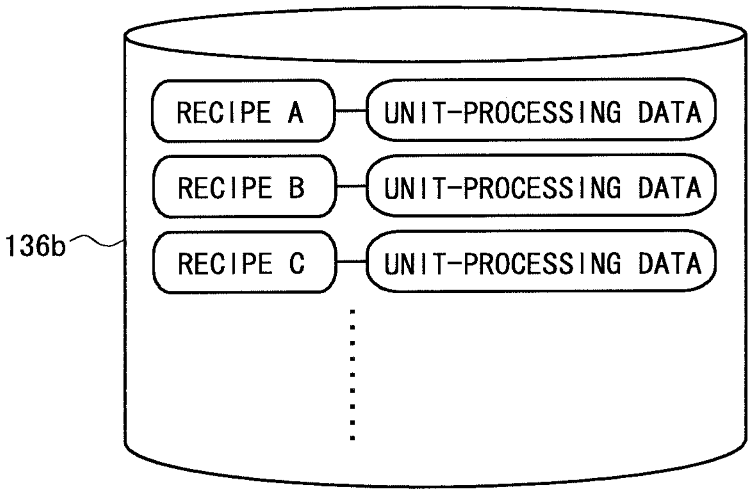
FIG. 7 is a diagram for explaining second reference data DB in the first embodiment.

Next, the configuration of the controller 100 of the substrate processing apparatus 1 will be described. FIG. 4 is a block diagram showing a hardware configuration of the controller 100. The controller 100 includes a CPU 110, a main memory 120, an auxiliary storage device 130, a display 140, an input part 150, and a communication controller 160. The CPU 110 performs various arithmetic processing and the like in accordance with a given command. The main memory 120 temporarily stores programs under execution, data, and the like. The auxiliary storage device 130 stores various programs and various pieces of data to be held even when the power is turned off. In the present embodiment, specifically, a data processing program 132 for executing data processing, described later, is stored in the auxiliary storage device 130. Further, the auxiliary storage device 130 is provided with time series data DB 134, a first reference data DB 136*a*, and a second reference data DB 136*b*. "DB" stands for "database." As schematically shown in FIG. 5, unit-processing data for a predetermined period is stored in the time series data DB 134. As schematically shown in FIG. 6, the first reference data DB 136*a* stores unit-processing data defined as reference data for each processing unit 22 and for each recipe ("recipe A", "recipe B", and "recipe C" represent different recipes). In the second reference data DB 136*b*, as schematically shown in FIG. 7, unit-processing data defined as reference data is stored for each recipe. While the first reference data DB 136*a* is provided to hold reference data to be compared with unit-processing data to be inspected at the time of detecting an abnormality or the like of processing performed in each processing unit 22, the second reference data DB 136*b* is provided to hold reference data to be transmitted and received at the time of performing reference data extension processing which will be described later. For example, the display 140 displays various screens for an operator to perform work. The input part 150 is, for example, a mouse, a keyboard, or the like, and accepts an input from the outside by the operator. The communication controller 160 controls data transmission and reception.

Note that the configuration of the DB is not limited to the configuration described above. For example, the configuration may be such that one DB is provided instead of the time series data DB 134, the first reference data DB 136*a*, and the second reference data DB 136*b*, so as to be distinguished from each other by table. Further, for example, the first reference data DB 136*a* may be provided for each processing unit 22.

When the substrate processing apparatus 1 is activated, the data processing program 132 is read into the main memory 120, and the CPU 110 executes the data processing program 132 read into the main memory 120. As a result, the substrate processing apparatus 1 functions as a data processing apparatus. Note that the data processing program 132 is provided in the form of being recorded on a recording medium such as a CD-ROM, a DVD-ROM, a flash memory, or the like, or in the form of being downloaded via a network.

<1.4 Overview of Reference Data Extension Processing (Data Processing Concerning Extension of Reference Data)>

Figure 8:
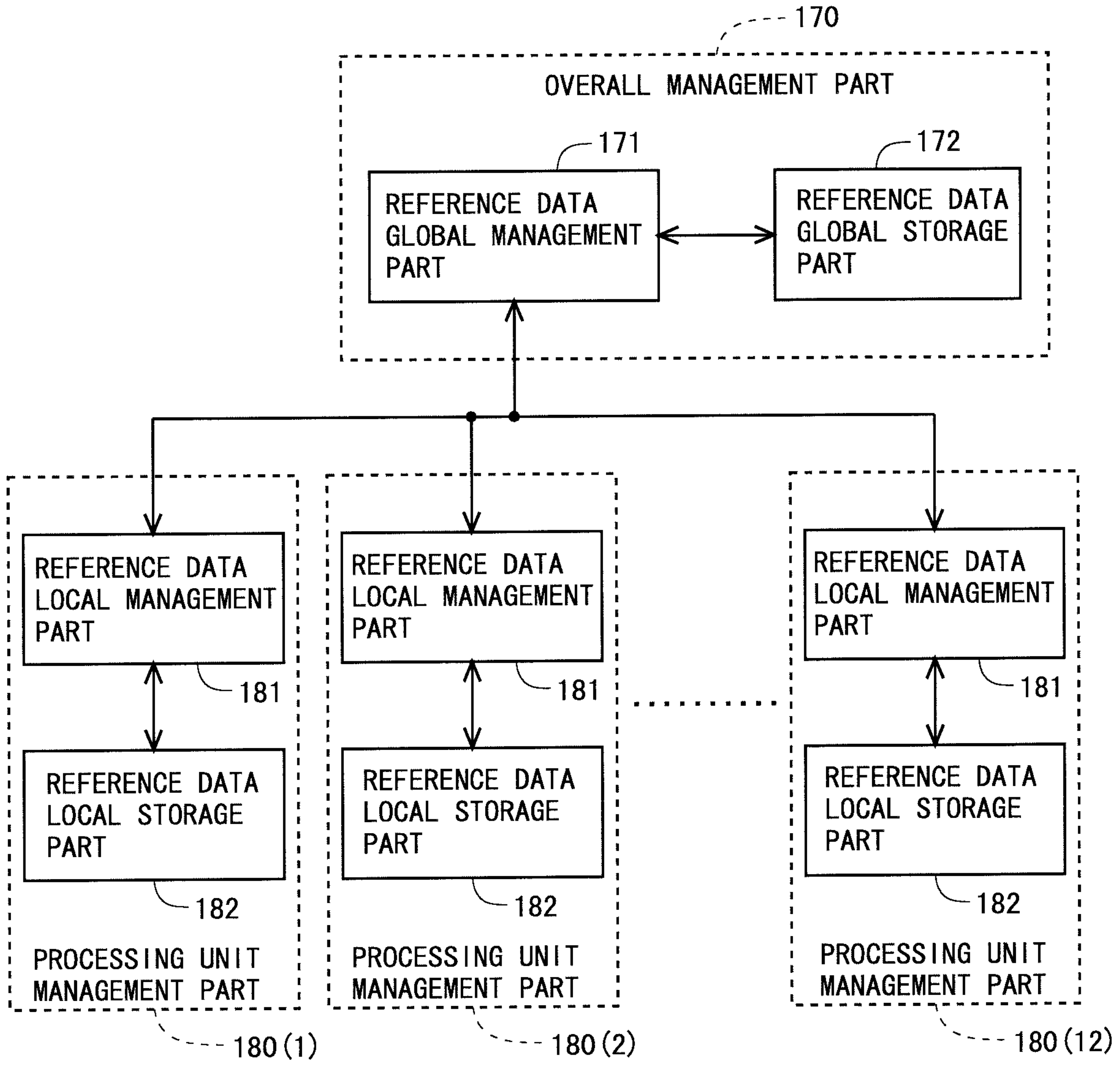
FIG. 8 is a functional block diagram showing a functional configuration relating to reference data extension processing in the first embodiment.

In the present embodiment, the reference data extension processing that extends reference data for a certain processing unit 22 to the other processing units 22 is performed. Note that the "extension of reference data" in the present specification means expansion of a usage range (usage target) of a target reference data. FIG. 8 is a functional block diagram showing a functional configuration relating to the reference data extension processing. As shown in FIG. 8, in the substrate processing apparatus 1, an overall management part 170 and twelve processing unit management parts 180(1) to 180(12) are provided as functional components relating to the reference data extension processing. The processing unit management parts 180(1) to 180(12) respectively correspond to Chamber1 to Chamber12 being the twelve processing units 22 described above. The overall management part 170 includes a reference data global management part 171 and a reference data global storage part 172. Each of the processing unit management parts 180(1) to 180(12) includes a reference data local management part 181 and a reference data local storage part 182. In the present embodiment, an extension management part is achieved by the overall management part 170, and a reference data extension part is achieved by the reference data local management part 181 and the reference data global management part 171.

In the reference data local storage part 182, reference data for the corresponding processing unit 22 is stored. The reference data local management part 181 manages the reference data for the corresponding processing unit 22 by using the reference data local storage part 182. Note that, although the reference data local storage part 182 is shown for each processing unit management part 180 in FIG. 8, in the present embodiment, all the reference data local storage parts 182 are achieved by, as the DB (database), one first reference data DB 136*a* (see FIG. 4) described above.

The reference data global storage part 172 stores reference data used for reference data extension processing. The reference data global management part 171 manages the reference data used for the reference data extension processing by using the reference data global storage part 172. Note that the reference data global storage part 172 is achieved by the second reference data DB 136*b* (see FIG. 4) described above.

In the present embodiment, one constituent as a unit-element is achieved by one processing unit 22 and one processing unit management part 180 corresponding thereto. Then, for each recipe, one constituent is defined as "main" and the other constituents (eleven constituents) are defined as "subordinate." Hereinafter, the constituent defined as "main" will be referred to as a "main unit", and the constituent defined as "subordinate" will be referred to as a "sub unit." The main unit corresponds to the main unit-element, and the sub unit corresponds to the sub unit-element. For the sake of convenience, the processing unit 22 and the processing unit management part 180 included in the constituent defined as "main" may be referred to as a "main unit", and the processing unit 22 and the processing unit management part 180 included in the constituent defined as "subordinate" may also be referred to as a "sub unit" in some cases. In the reference data global storage part 172, in addition to the reference data, information for specifying the main unit and sub unit is also stored for each recipe.

Concerning selection (designation) of the main unit, a screen for selecting the main unit may be displayed on the display 140 so that the operator can select the main unit, or the main unit may be automatically selected based on a result obtained using a self-measuring device. Examples of using the self-measuring device may include a method of measuring an etching amount (a difference between a film thickness before processing and a film thickness after processing) of the substrate processed in each processing unit 22 with a film pressure meter, and automatically selecting the main unit based on the measurement result.

In the reference data extension processing, the reference data is extended from the main unit to the sub unit, but the reference data is not extended from the sub unit to the main unit. For example, when the main unit for a certain recipe is the processing unit management part 180(1), the reference data for the recipe is extended from the processing unit management part 180(1) to the processing unit management parts 180(2) to 180(12).

The reference data extension processing is performed when the reference data is changed in the main unit. In other words, the reference data extension processing is performed with the change in the reference data in the main unit taken as a trigger. So, before describing a detailed procedure of the reference data extension processing, a procedure for changing the reference data in the main unit will be described.

<1.5 Change Procedure of Reference Data in Main Unit>

Figure 9:
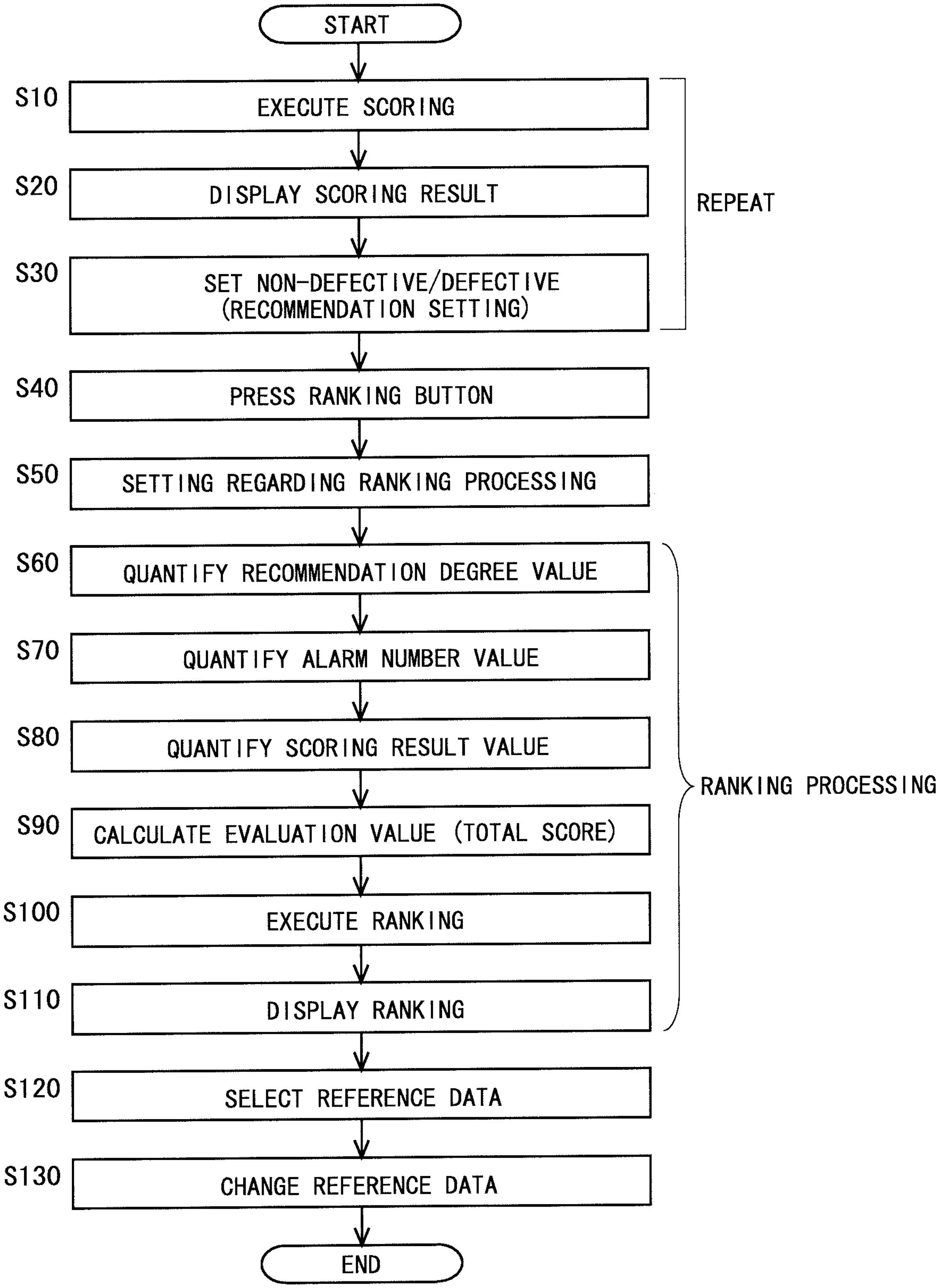
FIG. 9 is a flowchart showing a procedure for changing reference data in a main unit in the first embodiment.

In the substrate processing apparatus 1 according to the present embodiment, it is possible to change the reference data for each recipe as required. Hereinafter, focusing on one recipe, a description will be given of a procedure for changing the reference data in the main unit for the focused recipe. FIG. 9 is a flowchart showing the procedure for changing the reference data in the main unit. In the following description, unit-processing data to be evaluated is referred to as "evaluation target data."

First, scoring is performed based on the evaluation target data obtained, from the main unit, by executing a target recipe (hereinafter referred to as a "focused recipe") in the substrate processing apparatus 1 (step S10). Note that the scoring is processing of making comparison in time series data of each parameter between the evaluation target data and the reference data, and digitizing the result obtained by the comparison. If the focused recipe is executed by the eight processing units 22 including the main unit, the scoring is performed based on each of the eight pieces of evaluation target data obtained from the eight processing units 22 (i.e., the scoring is performed for each unit-processing), so that eight scoring results are obtained. In the scoring, "non-defective" or "defective" is determined for a plurality of evaluation items. This determination is made, for each parameter, by comparing an inspection value, obtained based on the time series data included in the evaluation target data and the time series data included in the reference data, with a threshold corresponding to the inspection value (substantially, the determination is made by comparing the time series data included in the evaluation target data with the time series data included in the reference data). In this regard, when the inspection value exceeds the threshold, the corresponding evaluation item is determined to be "defective." Note that a plurality of evaluation items may be provided for one parameter. In the present embodiment, the scoring result of each piece of evaluation target data is represented in a mode in which the denominator is taken as the total number of evaluation items and the numerator is taken as the number of evaluation items determined as defective.

Examples of evaluation items are listed below.

Example 1

An average value of time series data in a stable period (see FIG. 2) concerning a certain parameter Example 2

The maximum value of time series data in the stable period (see FIG. 2) concerning a certain parameter Example 3

A length of a rising period (see FIG. 2) concerning a certain parameter

Concerning the evaluation item of Example 1, "the difference between the average value of the time series data included in the evaluation target data and the average value of the time series data included in the reference data" in the stable period concerning the target parameter is the above inspection value. Concerning the evaluation item of Example 2, "the difference between the maximum value of the time series data included in the evaluation target data and the maximum value of the time series data included in the reference data" in the stable period concerning the target parameter is the above inspection value. Concerning the evaluation item of Example 3, "the difference between the length of the rising period for the time series data included in the evaluation target data and the length of the rising period for the time series data included in the reference data" is the above inspection value.

Meanwhile, at the time of the scoring, each time series data may be normalized. For example, with respect to each parameter, linear conversion may be performed on the time series data included in the evaluation target data so that the maximum value of the time series data included in the reference data is converted into 1 and the minimum value thereof is converted into 0. Although the time series data on each of a plurality of parameters is generally included in the evaluation target data, the time series data on each of only some parameters may be normalized. By normalizing the time series data as necessary, it is possible to more suitably calculate an evaluation value described later.

Figure 10:
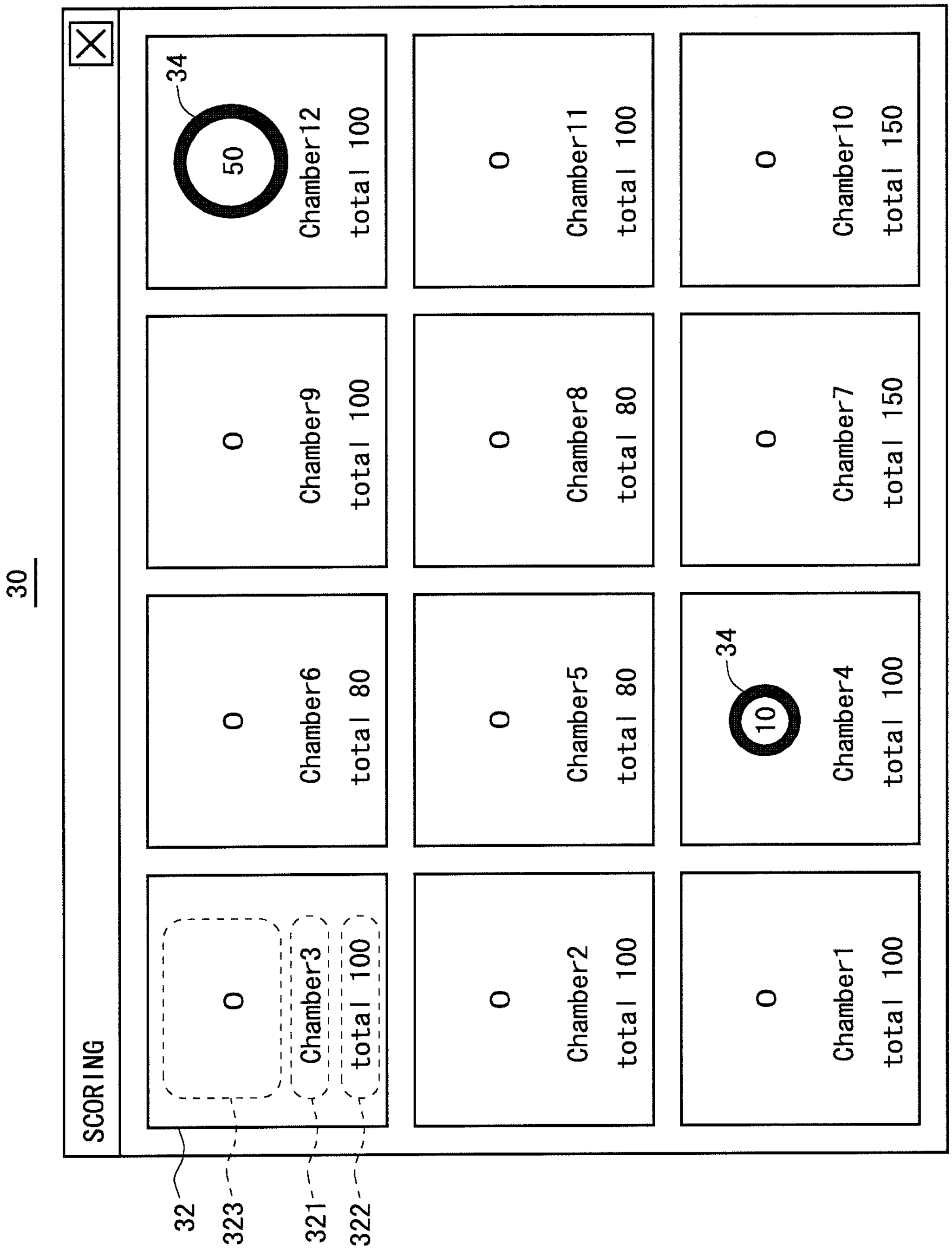
FIG. 10 is a view showing an example of a scoring screen in the first embodiment.

After the scoring is completed, the result of the scoring is displayed (step S20). In this regard, firstly, the scoring screen 30 showing the outline of the scoring result, for example as shown in FIG. 10, is displayed on the display 140. The scoring screen 30 is provided with buttons 32 in number equal to the number of processing units 22. In the button 32, a processing unit name display area 321, a processed number display area 322, and an error number display area 323 are provided. In the processing unit name display area 321, the name of the corresponding processing unit 22 is displayed. In the processed number display area 322, the total number of substrates processed within a predetermined period in the chamber in the corresponding processing unit 22 is displayed. In the error number display area 323, the number of generated error cases is displayed. For the processing unit 22 in which an error has occurred, a circle having a size corresponding to the number of error cases is displayed in the error number display area 323 as denoted by reference numeral 34.

When any one of the buttons 32 on the scoring screen as described above is pressed, a screen showing the scoring result of the unit-processing executed by the corresponding processing unit 22 is displayed. At the time of changing the reference data in the main unit, the button 32 corresponding to the main unit on the scoring screen 30 is pressed. When one unit-processing is selected on the screen displayed after the pressing of the button 32, a scoring result list screen 40, which displays a lift of scoring results for the recipe corresponding to the selected unit-processing, for example as shown in FIG. 11, is displayed on the display 140.

Figure 11:
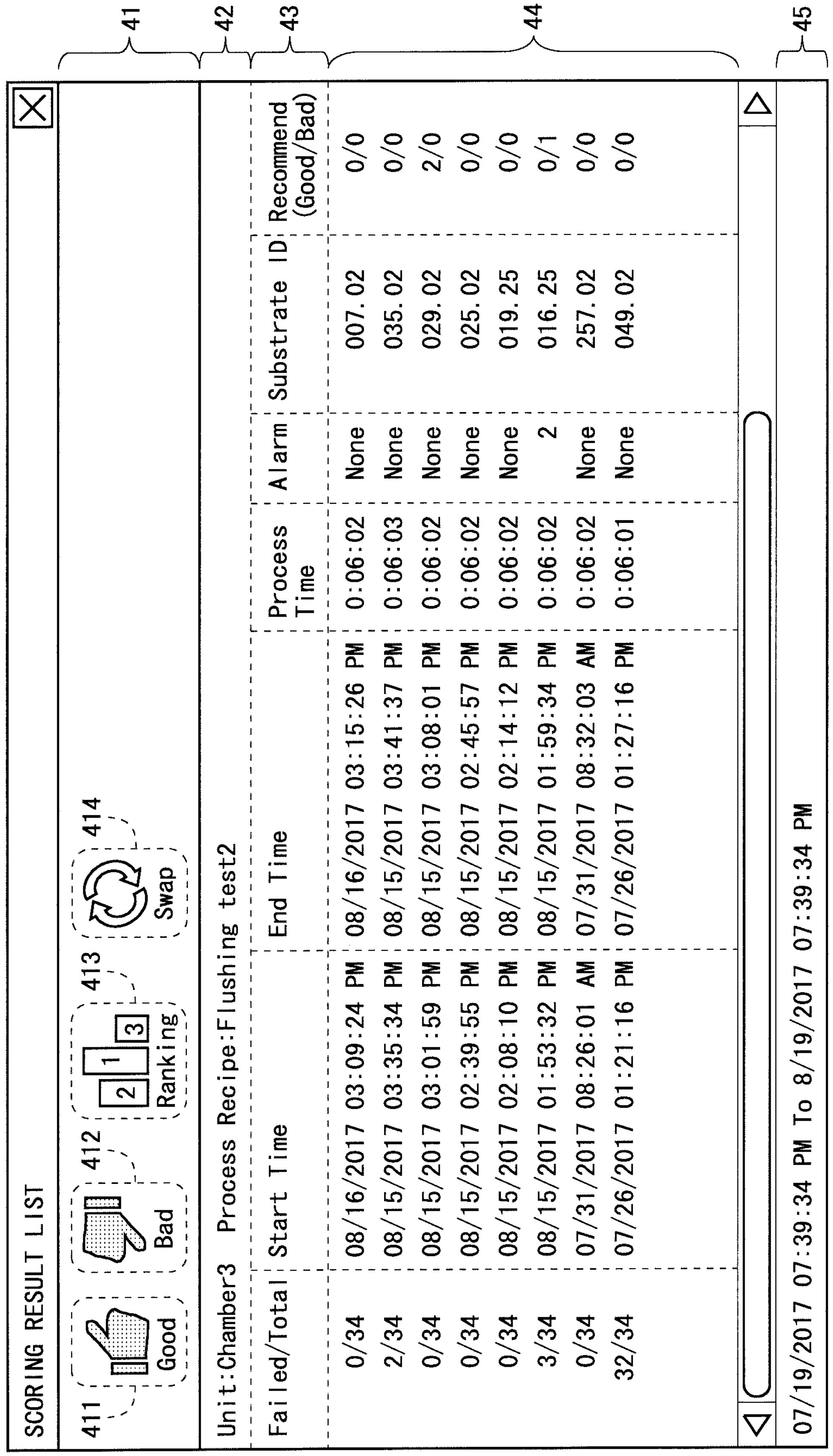
FIG. 11 is a view showing an example of a scoring result list screen in the first embodiment.

As shown in FIG. 11, the scoring result list screen 40 includes a button display area 41, a search target display area 42, an item name display area 43, a result display area 44, and a period display area 45. In the button display area 41, a Good button 411, a Bad button 412, a Ranking button 413, and a Swap button 414 are provided.

In the search target display area 42, the name of the processing unit 22 to be searched (in this case, the main unit) and the name of the recipe to be searched (in this case, the focused recipe) are displayed. In the example shown in FIG. 11, it is grasped that the name of the processing unit 22 to be searched is "Chamber3" and the name of the recipe to be searched is "Flushing test2."

In the item name display area 43, the item name of the content (attribute data) to be displayed in the result display area 44 is displayed. "Failed/Total" is an item name representing the scoring result. Note that "Failed" corresponds to the number of evaluation items determined to be defective, and "Total" corresponds to the total number of evaluation items. "Start time" is an item name representing the start time of the focused recipe. "End time" is an item name representing the end time of the focused recipe. "Process time" is an item name representing the processing time of the focused recipe. "Alarm" is an item name representing the number of alarms generated at the time of executing the focused recipe. "Substrate ID" is an item name representing a number for uniquely identifying a substrate (wafer) on which processing based on the focused recipe has been performed. "Recommend (Good/Bad)" is an item name representing the recommendation degree described later. Note that "Good" corresponds to a value representing the degree of high evaluation (hereinafter referred to as "Good value"), and "Bad" corresponds to a value representing the degree of low evaluation (hereinafter referred to as "Bad value"). The recommendation degree is made up of these Good value and Bad value.

In the result display area 44, attribute data (various pieces of information, scoring results, etc.) of the unit-processing data matching a search condition is displayed. In the example shown in FIG. 11, attribute data of each of eight pieces of unit-processing data is displayed in the result display area 44. The operator can select one piece of attribute data (one row) from the pieces of attribute data displayed in the result display area 44.

In the period display area 45, a preset search target period is displayed. The attribute data of the unit-processing data obtained by executing the focused recipe in this search target period is displayed in the result display area 44. In the example shown in FIG. 11, it is grasped that the search target period is one month from 7:39:34 pm on Jul. 19, 2017 to 7:39:34 pm on Aug. 19, 2017.

A function of each button provided in the button display area 41 will be described here. The Good button 411 is a button for the operator to press when it is desired to raise the evaluation value of the unit-processing data corresponding to the attribute data selected in the result display area 44. The Bad button 412 is a button for the operator to press when it is desired to lower the evaluation value of the unit-processing data corresponding to the attribute data selected in the result display area 44. The Ranking button 413 is a button for instructing execution of ranking processing. The Swap button 414 is a button for defining the unit-processing data corresponding to the attribute data selected in the result display area 44 as new reference data. Note that the evaluation value and the ranking processing will be described later.

Figure 12:
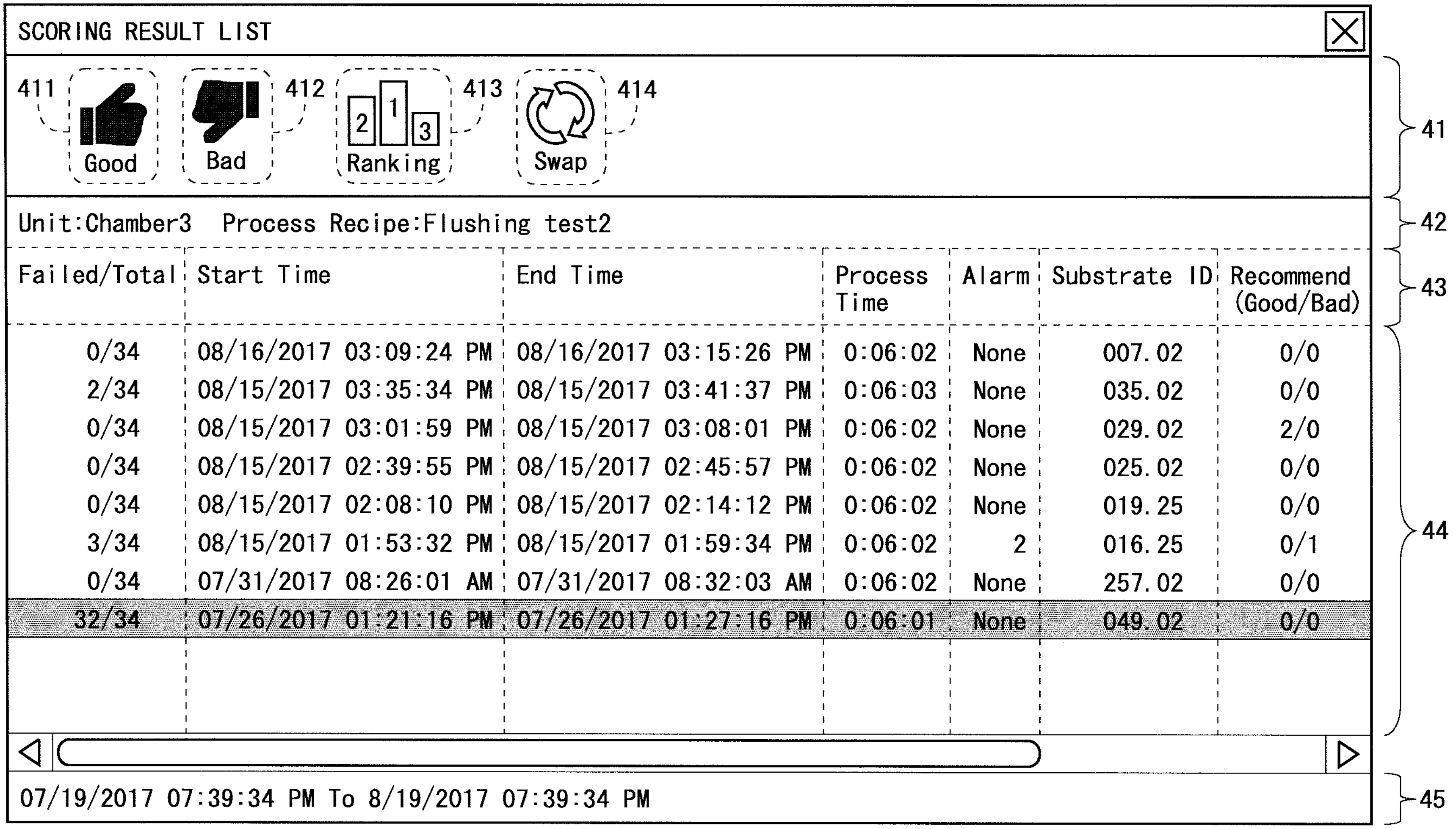
FIG. 12 is a view for explaining transition of the scoring result list screen at the time of recommendation setting in the first embodiment.
Figure 13:
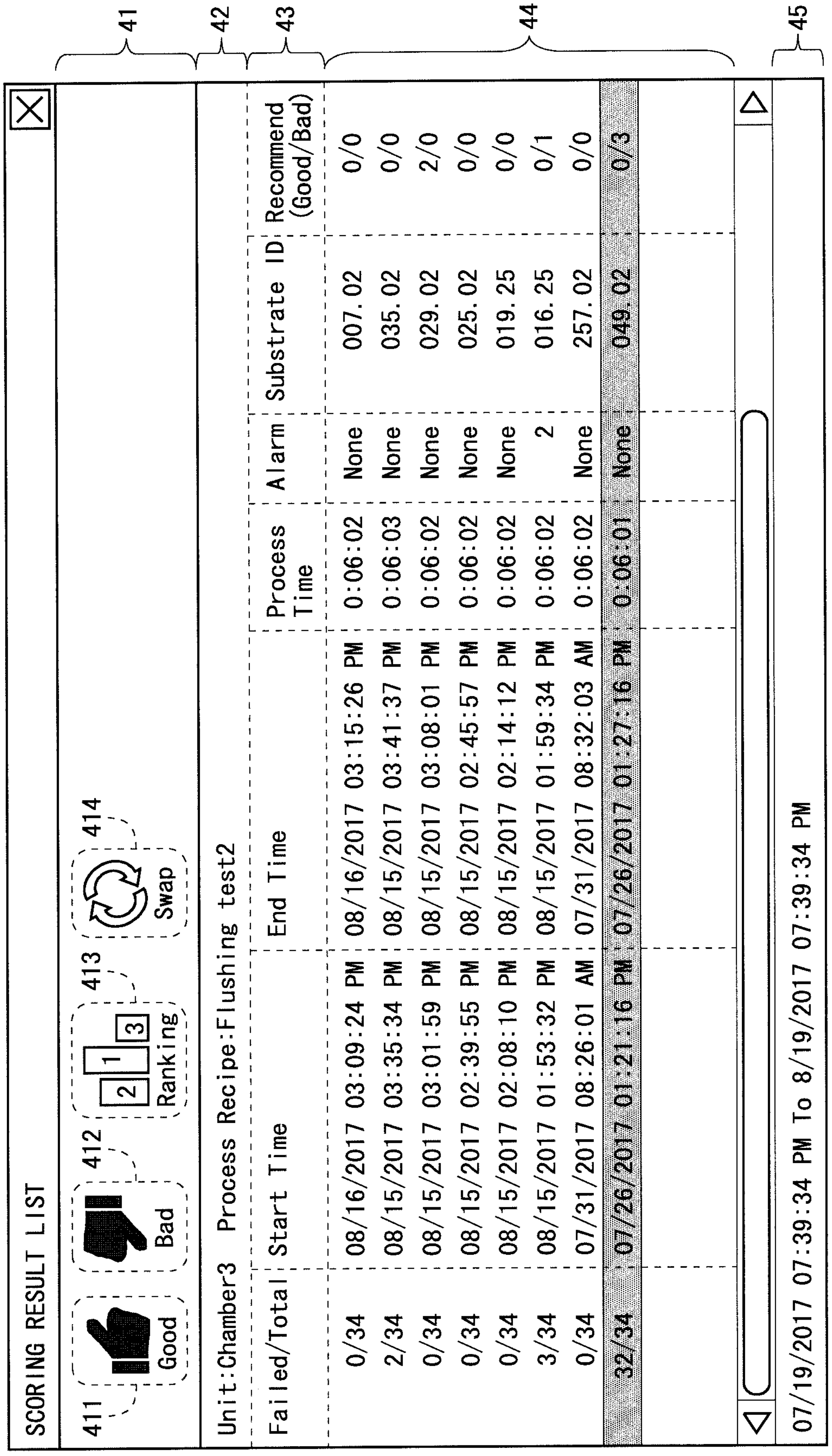
FIG. 13 is a view for explaining the transition of the scoring result list screen at the time of recommendation setting in the first embodiment.

After displaying the scoring result list screen 40, setting (recommendation setting) of the recommendation degree representing the degree of recommending each piece of unit-processing data as reference data is performed as necessary (step S30). The recommendation setting is performed by pressing the Good button 411 or the Bad button 412 in a state where the attribute data corresponding to the unit-processing data to be set among the attribute data displayed in the result display area 44 is selected. At that time, the operator presses the Good button 411 when the unit-processing data to be set is preferable as the reference data, and the operator presses the Bad button 412 when the unit-processing data to be set is not preferable as the reference data. In this regard, immediately after the displaying of the scoring result list screen 40, the Good button 411 and the Bad button 412 are in an un-selectable state. When the operator selects any of the attribute data displayed in the result display area 44 in this state, the corresponding attribute data comes into a selected state and the Good button 411 and the Bad button 412 come into the selectable state as shown in FIG. 12. The operator presses the Good button 411 or the Bad button 412 in this state to add the Good value and the Bad value. For example, when the Bad button 412 is pressed three times from the state shown in FIG. 12, the Bad value of the selected attribute data is "3" as shown in FIG. 13. As described above, the scoring result list screen 40 is configured such that the recommendation degree can be changed from the outside. Note that specifically what value is to be set for the Good value or the Bad value is determined considering, for example, the scoring result, the number of alarms, the state of the resultant object (substrate) obtained in the corresponding unit-processing (e.g., the number of particles, the number of defects, a collapse rate), and the like. In addition to the Good button 411 and the Bad button 412, a button for reducing the Good value and a button for reducing the Bad value may be provided.

Figure 14:
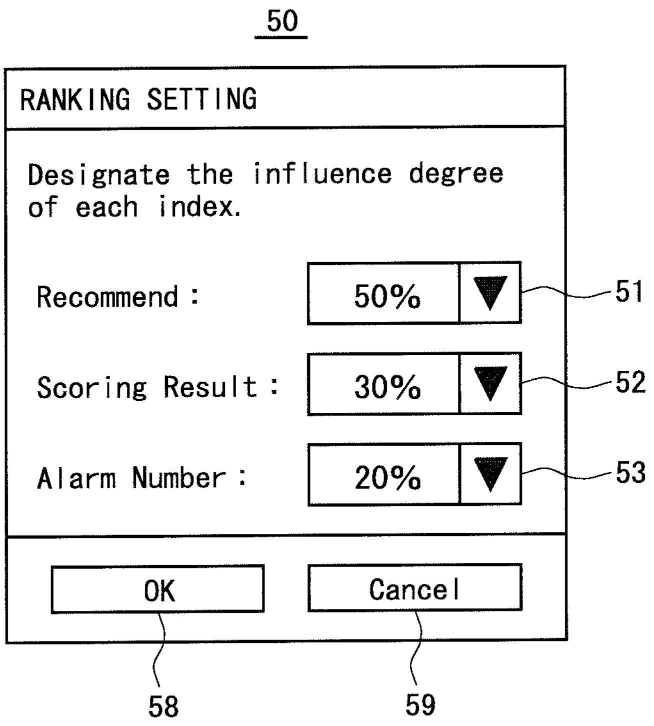
FIG. 14 is a view showing an example of a ranking setting screen in the first embodiment.

Meanwhile, each recipe is normally executed a plurality of times from the change in the reference data at a certain point of time until the next change in the reference data. That is, the scoring is usually executed a plurality of times from the change in the reference data at a certain point of time until the next change in the reference data. Therefore, with respect to a series of processing (a series of processing shown in FIG. 9) for changing the reference data once, the processing of step S10 to step S30 is usually repeated a plurality of times. When it is desired to change the reference data, the operator presses the Ranking button 413 in the scoring result list screen 40 (step S40). As a result, a ranking setting screen 50, for example as shown in FIG. 14, is displayed on the display 140. The ranking setting screen 50 is a screen for setting regarding ranking processing described later.

The ranking processing will be described here. The ranking processing in the present embodiment is a series of processing to perform, based on three indices, ranking on a plurality of pieces of unit-processing data (unit-processing data in a search target period) obtained by executing a designated recipe, and displaying the result of the ranking in a ranking format. Note that the ranking format refers to a format in which data is ranked in order from data ranked high to data ranked low. The rank of each piece of unit-processing data is determined by an evaluation value (total score) calculated based on the three indices. In the present embodiment, as the three index values for calculating the evaluation value, there are used a value based on the above-mentioned recommendation degree (hereinafter referred to as "recommended value"), a value based on the scoring result (hereinafter referred to as "scoring result value"), and a value based on the number of occurrence of alarms (or presence or absence of an alarm) (hereinafter referred to as "alarm value"). A specific way to obtain the evaluation value will be described later. In the ranking processing, a plurality of pieces of unit-processing data within the search target period are ranked based on the evaluation value, and attribute data corresponding to each piece of unit-processing data is displayed in the ranking format.

In step S50, a setting necessary for executing the ranking processing as described above is performed by the operator's operation using the ranking setting screen 50. FIG. 14 is a view showing an example of the ranking setting screen 50. As shown in FIG. 14, this ranking setting screen 50 includes an OK button 58, a cancel button 59, and three drop-down lists 51 to 53 for setting the influence degree (degree of contribution) of each of the above three index values at the time of calculating the evaluation value for determining the rank of each piece of unit-processing data. The drop-down list 51 is an interface for setting the influence degree of the recommended value. The drop-down list 52 is an interface for setting the influence degree of the scoring result value. The drop-down list 53 is an interface for setting the influence degree of the alarm value. The OK button 58 is a button for executing the ranking processing (the processing of steps S60 to S110) based on the setting contents. The Cancel button 59 is a button for canceling the setting contents (the contents having been set using the drop-down lists 51 to 53) and returning to the scoring result list screen 40.

For the drop-down lists 51 to 53, it is possible to set the influence degree at a step of 1%, for example. However, it is also possible to set the influence degree at a step of 5% or 10%. For the one that is not to be used as an index value at the time of calculating the evaluation value, it is possible to set the influence degree to 0%.

Meanwhile, when the setting value in the drop-down list 51 is defined as a "first setting value", the setting value in the drop-down list 52 is defined as a "second setting value", and the setting value in the drop-down list 53 is defined as a "third setting value", it is preferable to automatically adjust the values such that the sum of the first setting value, the second setting value, and the third setting value becomes 100%. In this regard, the configuration may be such that, when values are set for two drop-down lists after the displaying of the ranking setting screen 50, the value of the remaining drop-down list is set automatically. In this case, for example, when the setting of "first set value=50, second set value=30" is made, the third set value is automatically set to "20." Alternatively, the configuration may be such that, when the value for any one drop-down list is changed in a state where values for the three drop-down lists have already been set, the values for the remaining two drop-down lists are automatically changed while maintain the ratio thereof. In this case, for example, when the first setting value is changed to "55" in a state where "first setting value=70, second setting value=20, and third setting value=10" has been set, the second setting value is automatically changed to "30", and the third setting value is automatically changed to "15."

Note that, the configuration may be such that, such setting that the sum of the first set value, the second set value and the third set value exceeds 100% is accepted and internal processing is performed so as to make the sum be 100% while maintaining the ratio. Further, the configuration may be such that, when such setting that the sum of the first set value, the second set value and the third set value exceeds 100% is performed, a message indicating "the sum exceeds 100%" is displayed to prompt resetting.

After the influence degrees of the three index values have been set, when the OK button 58 on the ranking setting screen 50 is pressed, the ranking processing (processing of steps S60 to S110) is started. In the ranking processing, all pieces of unit-processing data, obtained from each processing unit 22 by the focused recipe being executed in the search target period, become evaluation target data.

First, the above recommended value is obtained for each piece of evaluation target data which can be candidates for reference data (step S60). When the Good value is represented as CntG and the Bad value is represented as CntB, a recommended value V(R) is calculated by the following Formula (1), for example.

$$V(R)=(\mathrm{Cnt}G-\mathrm{Cnt}B)\times 100/(\mathrm{Cnt}G+\mathrm{Cnt}B) \tag{1}$$

Here, when "CntG=0" and "CntB=0", "V(R)=0" is set.

Next, the above alarm value is obtained for each piece of evaluation target data (step S70). For the alarm value V(A), for example, "V(A)=100" is set when the number of alarms is 0 (indicated as "None" on the scoring result list screen 40), and "V(A)=−100" is set when the number of alarms is 1 or more.

Next, the above scoring result value V(S) is obtained for each piece of evaluation target data (step S80). When the total number of evaluation items is represented as Nt and the number of evaluation items determined as defective is represented as Nf, the scoring result value V(S) is calculated by the following Formula (2), for example.

$$V(S)(Nt-2\times Nf)\times 100/Nt \tag{2}$$

After the recommended value V(R), the alarm value V(A), and the scoring result value V(S) have been obtained as described above, the above evaluation value (total score) is calculated for each piece of evaluation target data (step S90). When the values (proportions) of the drop-down lists 51 to 53 set in step S50 are respectively represented as P1 to P3, the evaluation value (total score) Vtotal is calculated by the following Formula (3).

$$V\mathrm{total}=V(R)\times P1+V(S)\times P2+V(A)\times P3 \tag{3}$$

After the calculation of the evaluation values for all pieces of unit-processing data (evaluation target data) that can be candidates for the reference data, ranking on the unit-processing data is performed based on the calculated evaluation value (step S100). At that time, unit-processing data with a larger evaluation value is ranked higher (a numerical value representing the rank becomes smaller). Therefore, the unit-processing data ranked as the first is the unit-processing data having the largest evaluation value.

After completion of the ranking, a ranking screen 60 representing the result of the ranking, for example as shown in FIG. 15, is displayed on the display 140 (step S110). As shown in FIG. 15, attribute data for a plurality of pieces of unit-processing data is displayed on the ranking screen in the ranking format in accordance with the ranking results.

The ranking screen 60 includes a button display area 61, a search target display area 62, an item name display area 63, a result display area 64, and a period display area 65. Like the scoring result list screen 40, a Good button 411, a Bad button 412, a Ranking button 413, and a Swap button 414 are provided in the button display area 61.

In the search target display area 62, the name of the processing unit 22 to be searched and the name of the recipe to be searched (in this case, the focused recipe) are displayed. In the example shown in FIG. 15, it is grasped that the names of the processing units 22 to be searched are "Chamber3", "Chamber4", and "Chamber5" and the name of the recipe to be searched is "Flushing test2." While only the processing unit 22 selected on the scoring screen 30 (see FIG. 10) has been the search target on the scoring result list screen 40 (see FIG. 11), all the processing units 22 for which the focused recipe is executed in the search target period are search targets on the ranking screen 60. However, the configuration may be such that only the processing unit (here, the main unit) selected on the scoring screen 30 is set as a search target also on the ranking screen 60.

In the item name display area 63, the item name of the content (attribute data) to be displayed in the result display area 64 is displayed. "Ranking" is an item name representing a rank based on the ranking. "Total Score" is an item name representing the evaluation value (total score). "Recommend Score" is an item name representing a value (V(R)×P1) obtained by multiplying the recommended value by the ratio set in the drop-down list 51 of the ranking setting screen 50. "Scoring Result Score" is an item name representing a value (V(S)×P2) obtained by multiplying the scoring result value by the ratio set in the drop-down list 52 of the ranking setting screen 50. "Alarm Number Score" is an item name representing a value (V(A)×P3) obtained by multiplying the alarm value by the ratio set in the drop-down list 53 of the ranking setting screen 50. "Unit" is an item name representing the processing unit. "Start time" is an item name representing the start time of the focused recipe. "End time" is an item name representing the end time of the focused recipe. "Process time" is an item name representing the processing time of the focused recipe.

In the result display area 64, attribute data (various pieces of information, ranks based on ranking, etc.) of the unit-processing data matching a search condition is displayed. As can be grasped from FIG. 15, in the result display area 64, the attribute data of the unit-processing data is displayed in a state sorted from one having a high evaluation value to one having a low evaluation value. Therefore, the unit-processing data corresponding to attribute data displayed on the first row of the result display area 64 is the unit-processing data having the largest evaluation value among the unit-processing data matching the search condition. The operator can select one piece of attribute data (one row) from the pieces of attribute data displayed in the result display area 64.

As in the period display area 45 of the scoring result list screen 40, the search target period is displayed in the period display area 65. In the example shown in FIG. 15, it is grasped that the search target period is one month from 7:39:34 pm on Jul. 19, 2017 to 7:39:34 pm on Aug. 19, 2017.

After displaying of the ranking screen 60, the reference data after change is selected by the operator (step S120). Specifically, the operator selects attribute data corresponding to unit-processing data to be set as the reference data after change from the attribute data displayed in the result display area 64 on the ranking screen 60. This brings the selected attribute data into the selected state on the ranking screen 60. In this state, the operator presses the Swap button 414 in the button display area 61. As a result, the reference data for the focused recipe concerning the main unit is changed (step S130). Specifically, the unit-processing data corresponding to the focused recipe among the unit-processing data for the main unit held in the first reference data DB 136*a* (see FIG. 6) is rewritten to unit-processing data corresponding to the attribute data in the selected state in the result display area 64. Since the reference data can be determined based on the ranking result as described above, it is possible to define the unit-processing data having an ideal time series value as the reference data after change.

Figure 16:
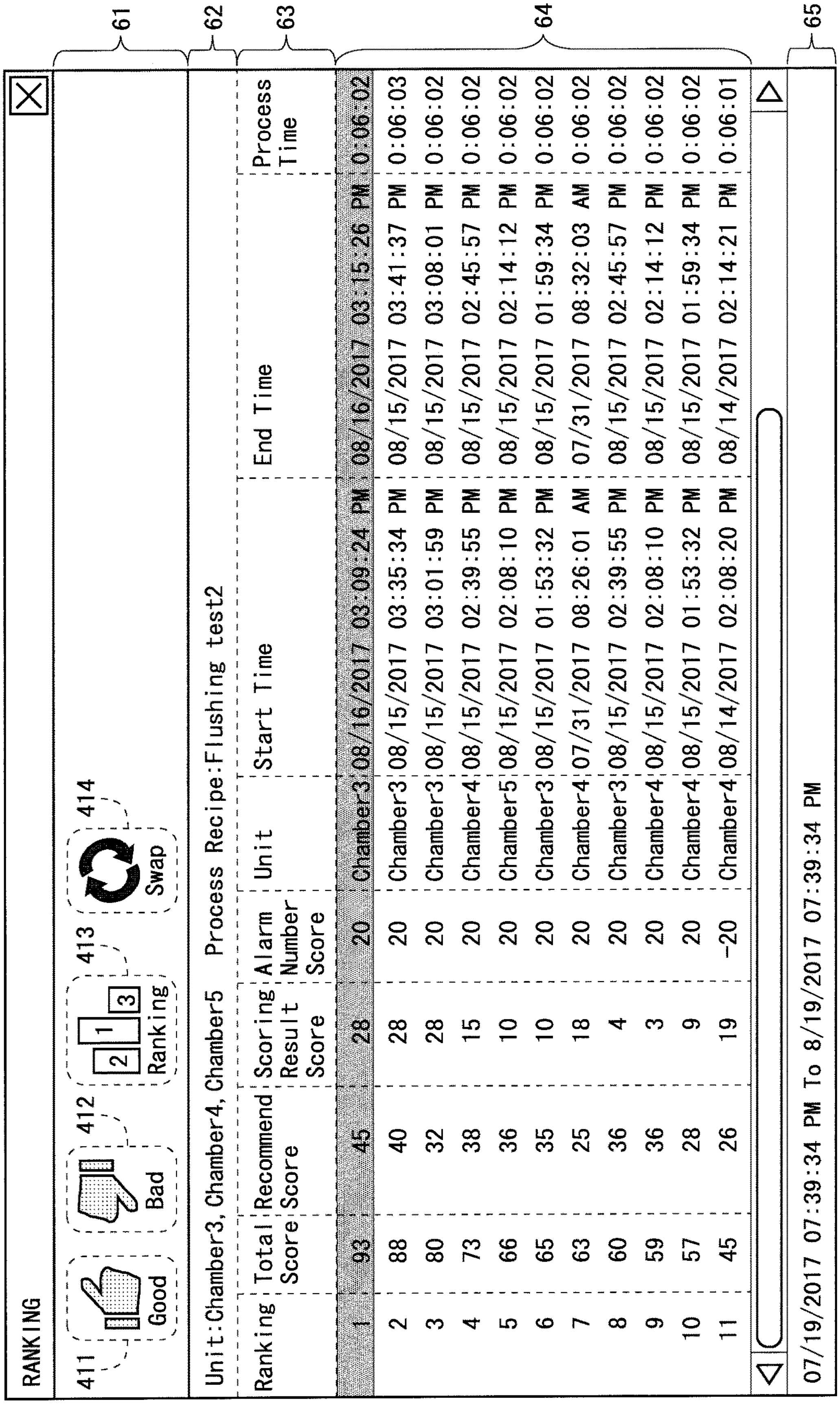
FIG. 16 is a view for explaining transition of the ranking screen at the time when reference data is changed in the first embodiment.

For example, when the operator selects the attribute data on the first row in the result display area 64 while the ranking screen 60 is in the state shown in FIG. 15, the attribute data on the first row comes into the selected state and the Swap button 414 comes into a pressable state as shown in FIG. 16. When the operator presses the Swap button 414 in this state, the reference data for the focused recipe is changed to the unit-processing data corresponding to the attribute data on the first row.

Note that, according to the present embodiment, it is also possible to select unit-processing data with a rank other than the first rank based on the ranking as the reference data. In this manner, it is possible to select the reference data matching the needs of the user.

By changing the reference data as described above, the series of processing shown in FIG. 9 is completed. In the present embodiment, a unit-processing data evaluating step is achieved by the above steps S10 to S90. Note that the configuration may be such that only the data for the main unit is displayed in the result display area 64 on the ranking screen 60 when the reference data for the main unit is changed.

Figure 17:
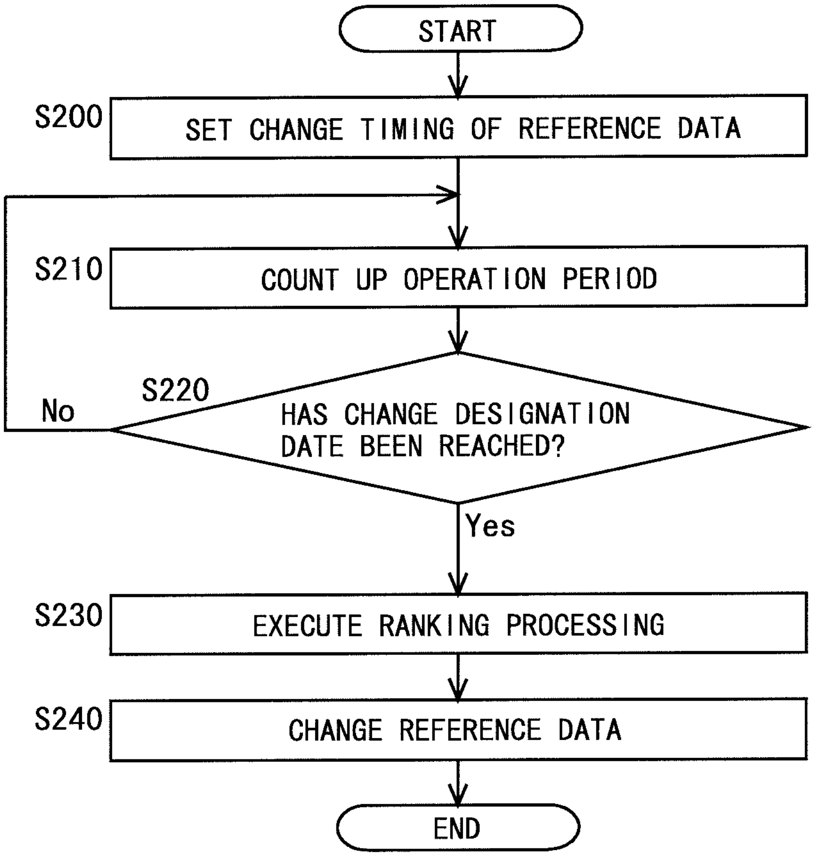
FIG. 17 is a flowchart showing a procedure of data processing concerning the change in the reference data in the first embodiment.

Meanwhile, with respect to each recipe, the reference data for the main unit may be changed at previously designated timing. The procedure for changing the reference data in the main unit in this case will be described with reference to a flowchart shown in FIG. 17. Note that a series of processing shown in FIG. 17 is performed by the controller 100 of the substrate processing apparatus 1.

Figure 18:
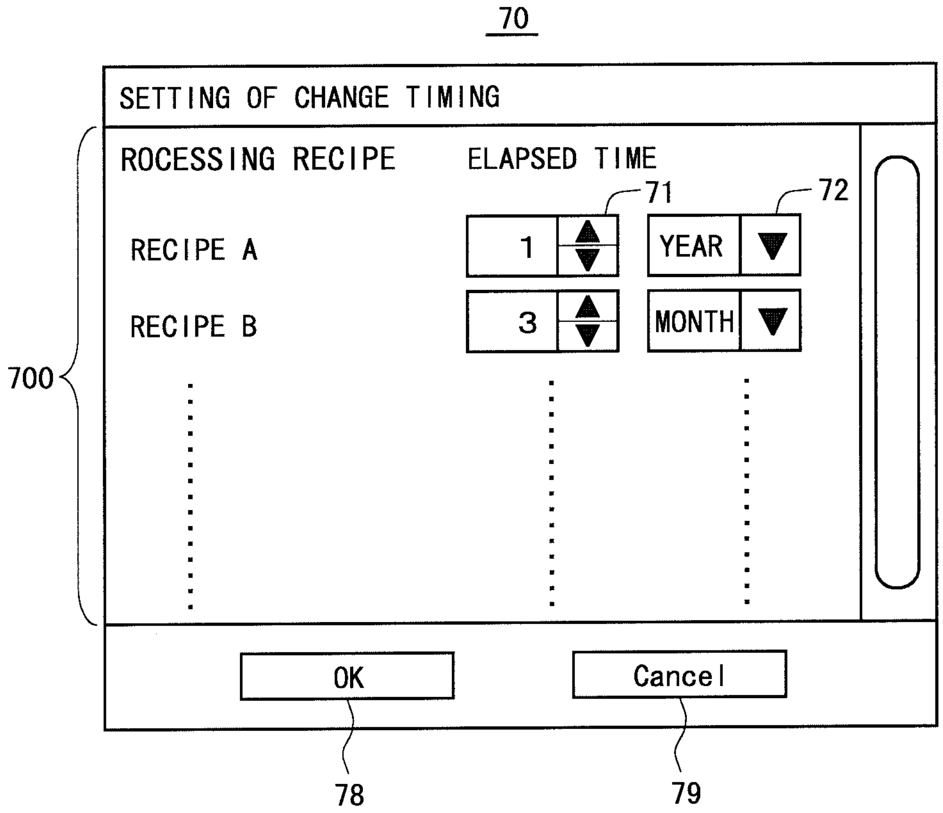
FIG. 18 is a view showing an example of a change timing setting screen in the first embodiment.

First, the change timing of the reference data is set by the operator's operation (step S200). At that time, a change timing setting screen 70, for example as shown in FIG. 18, is displayed on the display 140. The change timing setting screen 70 includes a setting area 700, an OK button 78, and a Cancel button 79. The OK button 78 is a button for confirming the setting contents. The Cancel button 79 is a button for canceling the setting contents.

In the setting area 700 on the change timing setting screen 70, it is possible to set the change timing of the reference data for the main unit for each recipe. The change timing is set by designating elapsed time, which is a length of a period from a change in the reference data at a certain point in time to the next change in the reference data, (i.e., a time interval for changing the reference data) for each recipe.

As shown in FIG. 18, in the setting area 700, a spin control box 71 and a drop-down list 72 are provided for each recipe. The spin control box 71 is an interface for designating the length of the period to be set. The spin control box 71 is configured so as to be able to increase or decrease the numerical value representing the length of the period. The drop-down list 72 is an interface for designating a unit of a period to be set. The unit that can be designated in this drop-down list 72 is any of "year", "month", and "day." The operator operates the spin control box 71 and the drop-down list 72 to set the change timing of the reference data for each recipe. In the example shown in FIG. 18, the reference data for the main unit concerning the recipe named "recipe A" is changed every year, and the reference data for the main unit concerning the recipe named "recipe B" is changed every three months.

With respect to the flow shown in FIG. 17, after the change timing of the reference data is set using the change timing setting screen 70 as described above, the controller 100 counts up the operation period (step S210). Specifically, a variable (hereinafter referred to as "operation period variable") CntD for counting the operation period is prepared in the data processing program 132, and the value of the operation period variable CntD is incremented by one every time one day passes.

When the value of the operation period variable CntD is incremented by one, for each recipe, it is determined whether or not the date on which the reference data is to be changed (hereinafter referred to as "change designation date") has been reached, based on setting contents on the change timing setting screen 70 (step S220). As a result of the determination, when there is a recipe whose change designation date has been reached, the processing proceeds to step S230. On the other hand, when there is no recipe whose change designation date has been reached, the processing returns to step S210.

Figure 19:
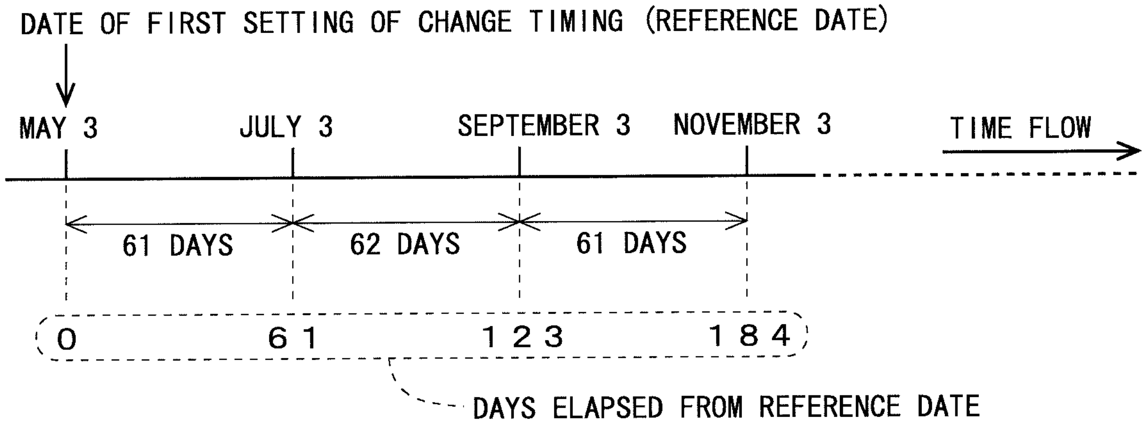
FIG. 19 is a diagram for explaining determination as to whether or not a change designation date has been reached in the first embodiment.

With reference to FIG. 19, an example of a specific method for determining whether or not the change designation date has been reached will be described here. However, the present invention is not limited thereto. It is assumed that count of the operation period variable CntD is performed using the date on which the change timing is first set as a reference date. Further, it is assumed that the elapsed time concerning a certain recipe has been set to "two months" on the change timing setting screen 70. At this time, for example, in a case in which the reference date is May 3 of a certain year, as shown in FIG. 19, the change designation date for the target recipe is the date every two months from May 3 (i.e. July 3, September 3, November 3, . . . ). From the information of the change designation date and the information of the reference date, the number of days elapsed from the reference date can be obtained for each change designation date. For example, as for September 3 of the same year as the reference date, the number of days since the reference date is 123. Since the number of days elapsed from the reference date to each change designation date can be obtained as thus described, it is possible to determine whether or not the change designation date has been reached by comparing the number of days elapsed with the value of the operation period variable CntD. For example, on July 3, the value of the operation period variable CntD becomes "61", and therefore it can be determined that the change designation date has been reached for the corresponding setting target.

Figure 20:
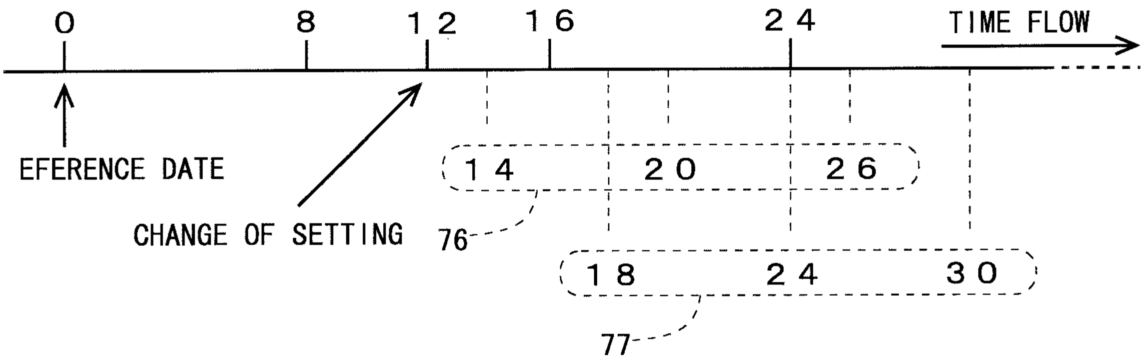
FIG. 20 is a diagram for explaining a change in the change designation date associated with a setting change for change timing in the first embodiment.

Meanwhile, after the change timing has been first set, the setting change of the change timing may be made for each recipe. How the change designation date changes in accordance with the setting change of the change timing in such a case will be described with reference to FIG. 20. It is assumed here that the change timing (elapsed time) for a certain recipe has been changed from "8 days" to "6 days." Further, it is assumed that the setting change was made after the lapse of 12 days from the reference date. In this case, at the point in time when the change timing is first set, the change designation date for the target recipe becomes the date every eight days from the reference date (the number of days elapsed from the reference date is 8, 16, 24, . . . ). In this state, as described above, the setting change is made after the lapse of 12 days from the reference date. At this time, since the latest change in the reference data was made 8 days after the reference date, for example, as denoted by reference numeral 76 in FIG. 20, the date every six days from the day after the eight days from the reference date (the number of days elapsed from the reference date is 14, 20, 26, . . . ) can be defined as the change designation date. Further, for example, as denoted by reference numeral 77 in FIG. 20, the date every six days from the date on which setting change is made (the number of days elapsed from the reference date is 18, 24, 30, . . . ) can also be defined as the change designation date. In this manner, the processing in the case where the setting change of the change timing is made is not particularly limited, and the change designation date may be changed in accordance with an appropriately defined rule.

With respect to the flow shown in FIG. 17, in step S230, the ranking processing described above is performed in order to determine the unit-processing data to be the reference data after change (step S230). Thereafter, based on the result of the ranking processing, the reference data for the main unit concerning the recipe whose change designation date has been reached is changed (step S240). Specifically, the unit-processing data corresponding to the target recipe among the unit-processing data for the main unit held in the first reference data DB 136*a* (see FIG. 6) is rewritten to the unit-processing data ranked as the first in the ranking processing in step S230.

As described above, the configuration may be such that the change timing of the reference data for the main unit can be set for each recipe and the reference data for the main unit concerning the recipe whose change timing has been reached is automatically rewritten to the unit-processing data ranked as the first in the ranking processing.

<1.6 Procedure of Reference Data Extension Processing>

Figure 21:
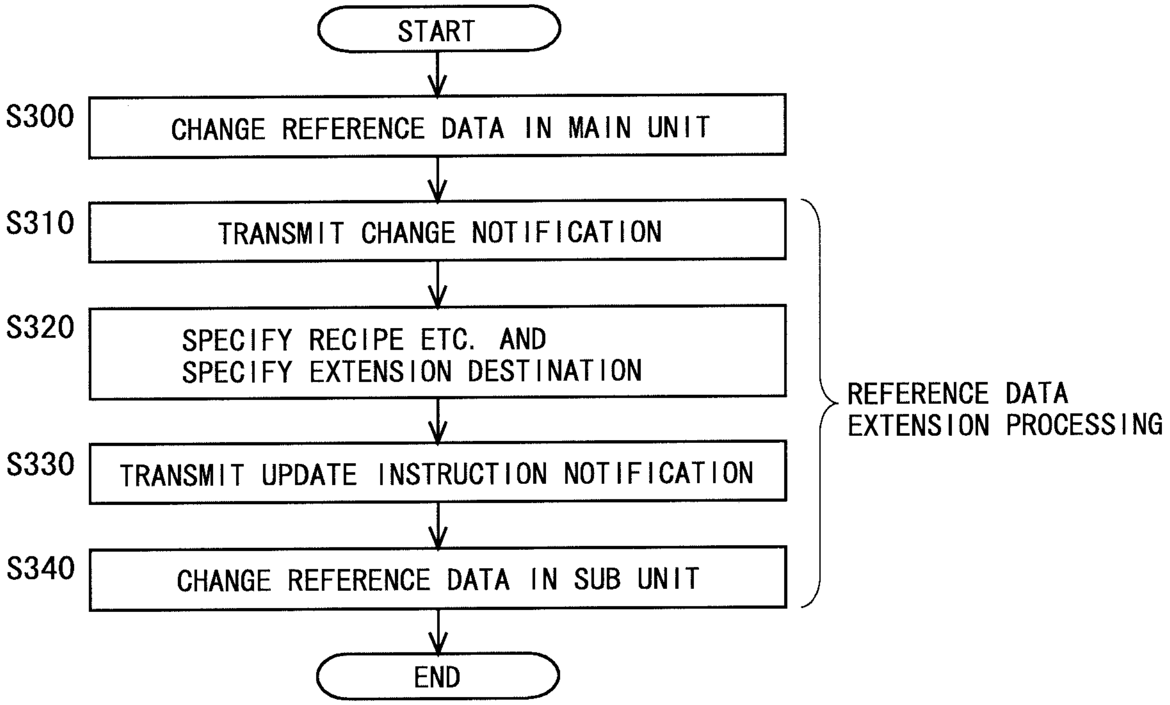
FIG. 21 is a flowchart showing a procedure of the reference data extension processing in the first embodiment.

Next, based on the contents described above, the procedure of the reference data extension processing will be described. FIG. 21 is a flowchart showing the procedure of the reference data extension processing in the present embodiment. A series of processing shown in FIG. 21 is achieved by the CPU 110 in the controller 100 executing the data processing program 132 in the substrate processing apparatus 1.

Figure 22:
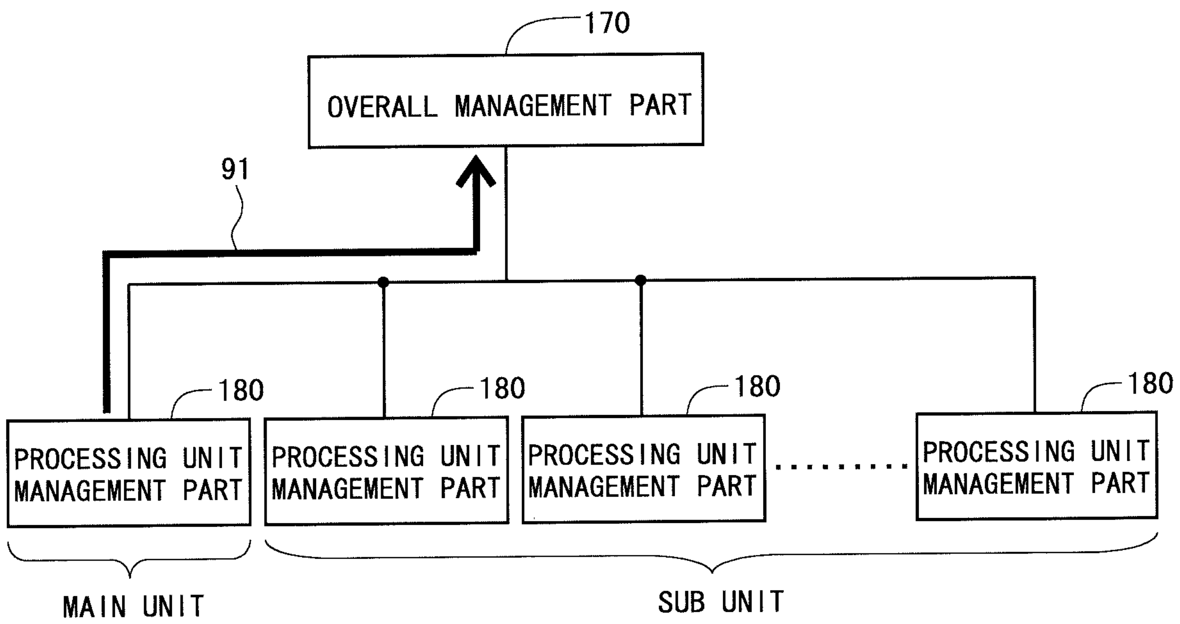
FIG. 22 is a diagram for explaining transmission of a change notification in the first embodiment.

First, in the main unit, a change in the reference data (an update of the reference data stored in the reference data local storage part 182) is made (step S300). With the change in the reference data in step S300 taken as a trigger, the reference data local management part 181 of the main unit transmits a change notification indicating the change in the reference data together with the reference data after change (hereinafter referred to as "new reference data") to the reference data global management part 171 in the overall management part 170 (step S310). In this manner, in step S310, as indicated by an arrow marked with reference numeral in FIG. 22, the change notification is transmitted together with new reference data from the main unit to the overall management part 170.

Next, the reference data global management part 171 in the overall management part 170 specifies the processing unit 22 whose reference data has been changed (i.e., main unit) and a recipe whose reference data has been changed, based on the change notification and the new reference data transmitted in step S310 (step S320). Then, the reference data global management part 171 specifies the processing unit 22 to be an extension destination of the new reference data (i.e., sub unit) by referring to the reference data global storage part 172. Further, the reference data global management part 171 changes (updates) the reference data for the target recipe among the reference data stored in the reference data global storage part 172 to the new reference data.

Figure 23:
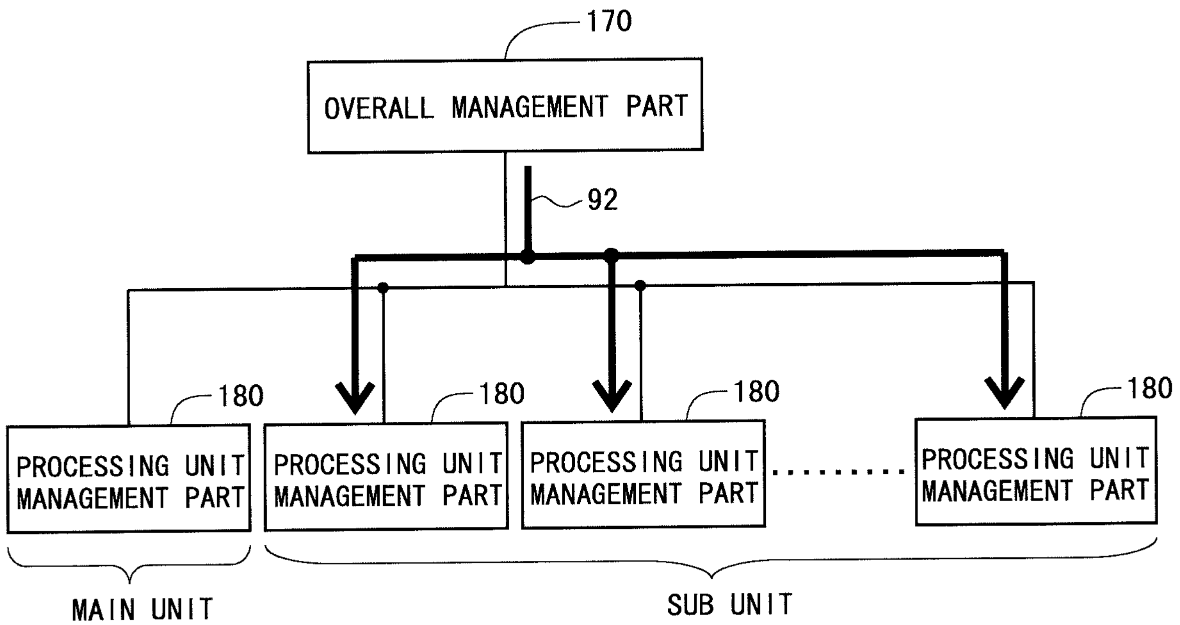
FIG. 23 is a diagram for explaining transmission of an update instruction notification in the first embodiment.

Next, the reference data global management part 171 in the overall management part 170 transmits an update instruction notification together with the new reference data to the sub unit specified in step S320 (i.e., the processing unit 22 being the extension destination of the new reference data) (step S330). As described above, in step S330, as indicated by an arrow marked with reference numeral 92 in FIG. 23, the update instruction notification is transmitted together with the new reference data from the overall management part 170 to the sub unit.

Thereafter, in each sub unit, the reference data local management part 181 changes (updates) the reference data for the target recipe among the reference data stored in the reference data local storage part 182 to the new reference data based on the update instruction notification (step S340). This completes the reference data extension processing.

Note that, in the present embodiment, a reference data changing step is achieved by step S300, and a reference data extending step is achieved by steps S310 to S340. Further, a reference data uploading step is achieved by step S310, an extension destination specifying step is achieved by step S320, a reference data downloading step is achieved by step S330, and a reference data updating step is achieved by step S340.

<1.7 Effects>

According to the present embodiment, in the substrate processing apparatus 1 in which the reference data (data selected from a plurality of pieces of unit-processing data each including a plurality of pieces of time series data, and data to be compared with each piece of unit-processing data) is defined for each processing unit 22 for each recipe, when the reference data for a certain recipe is changed in the processing unit 22 defined as a main unit concerning the target recipe, the reference data after change is extended to the processing unit 22 defined as a sub unit concerning the target recipe. As a result, for example, also for the processing unit 22 for which a favorable result concerning a certain recipe has not been obtained, it is possible to hold unit-processing data of a favorable result concerning the target recipe as reference data. In this manner, unit-processing data obtained by processing in each processing unit 22 can be compared with suitable reference data, so that an abnormality of processing executed in the substrate processing apparatus 1 can be detected accurately. As described above, according to the present embodiment, it is possible to perform the abnormality detection using time series data more accurately than before.

2. Second Embodiment

In the first embodiment, the extension of the reference data from the main unit to the sub unit is performed in one substrate processing apparatus 1. In contrast, in the present embodiment, reference data is extended between a plurality of substrate processing apparatuses 1. Hereinafter, differences from the first embodiment will be mainly described, and description of similarities to the first embodiment will be omitted as appropriate.

<2.1 Schematic Configuration of System>

Figure 24:
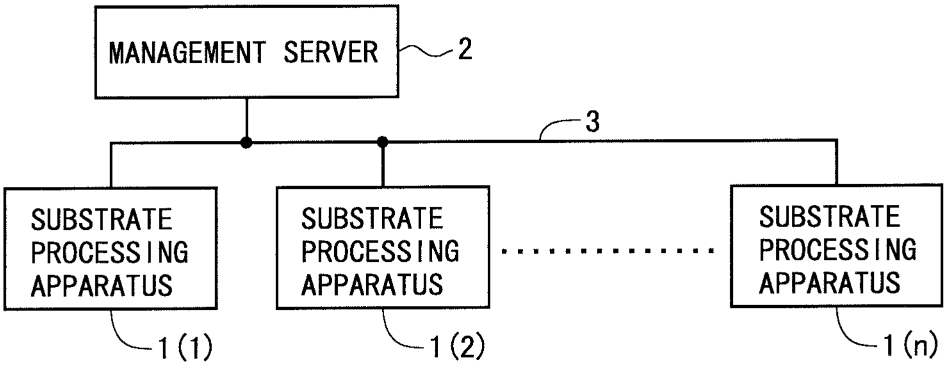
FIG. 24 is a diagram showing a schematic configuration of a substrate processing system according to a second embodiment of the present invention.

FIG. 24 is a diagram showing a schematic configuration of a substrate processing system (data processing system) according to a second embodiment of the present invention. This substrate processing system is made up of a plurality of (n) substrate processing apparatuses 1(1) to 1(*n*) and a management server 2 for managing the plurality of substrate processing apparatuses 1(1) to 1(*n*). The plurality of substrate processing apparatuses 1 and the management server 2 are connected to each other via a network (communication line) 3 such as a LAN. A schematic configuration of each substrate processing apparatus 1 is the same as that of the first embodiment (see FIG. 1).

<2.2 Configuration of Controller of Substrate Processing Apparatus>

Figure 25:
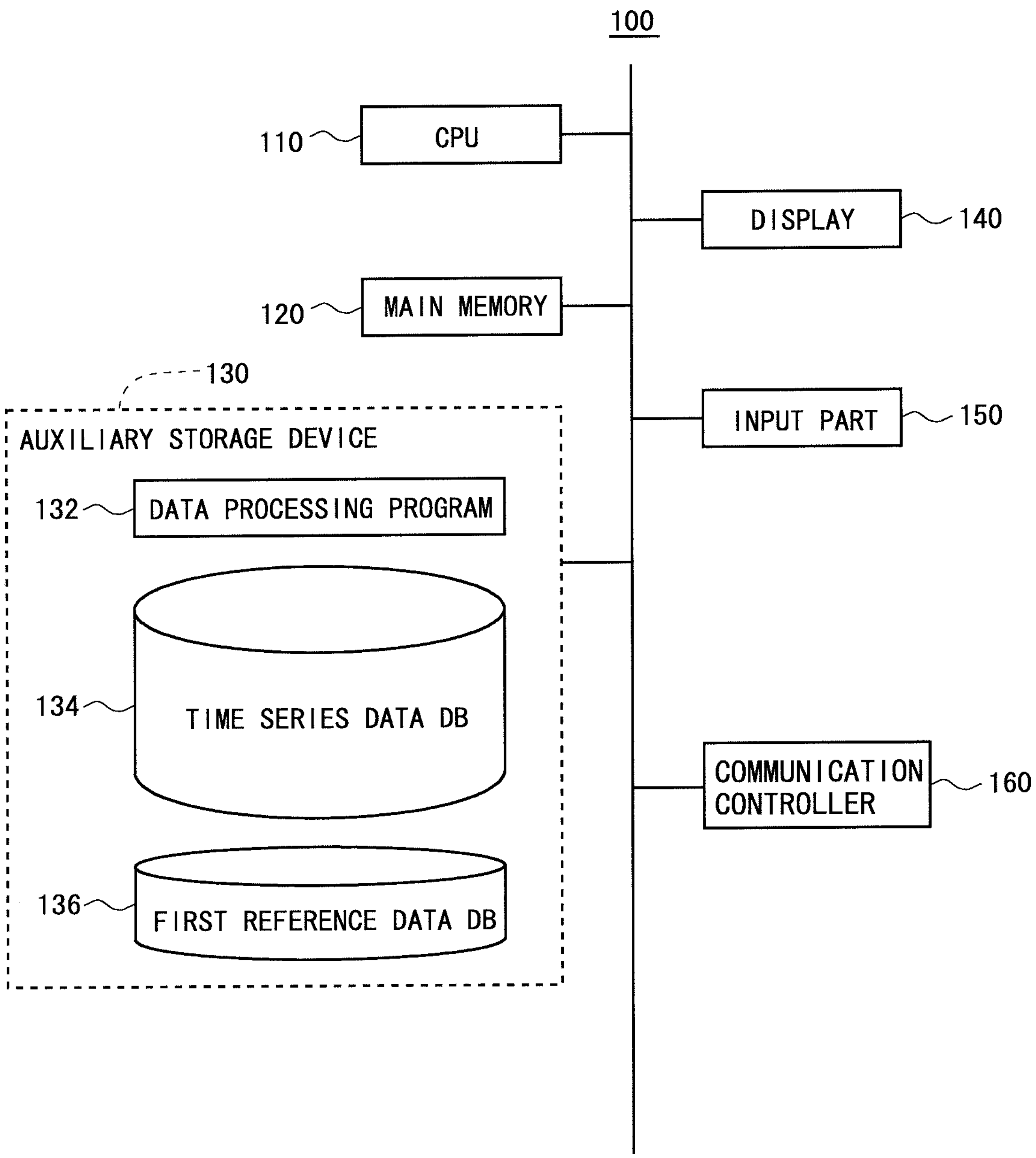
FIG. 25 is a block diagram showing a hardware configuration of a controller of a substrate processing apparatus in the second embodiment.
Figure 26:
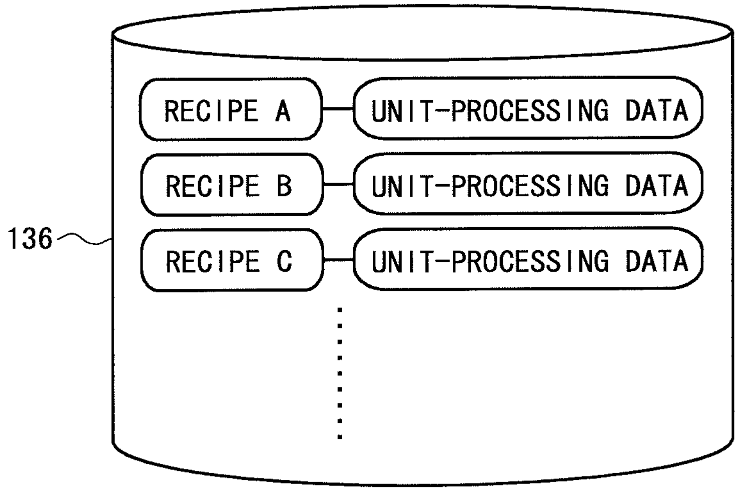
FIG. 26 is a diagram for explaining first reference data DB in the second embodiment.

Next, the configuration of the controller 100 of the substrate processing apparatus 1 will be described. FIG. 25 is a block diagram showing a hardware configuration of the controller 100 of the substrate processing apparatus 1. Although the first reference data DB 136*a* and the second reference data DB 136*b* are provided as the DB for storing the reference data in the first embodiment, only the first reference data DB 136 is provided in the present embodiment. In the first reference data DB 136, as schematically shown in FIG. 26, unit-processing data defined as the reference data is stored for each recipe. In this manner, in the present embodiment, in each substrate processing apparatus 1, the reference data is determined for each recipe irrespective of the number of processing units 22 (the number of chambers).

When the substrate processing apparatus 1 is activated, the data processing program 132 is read into the main memory 120, and the CPU 110 executes the data processing program 132 read into the main memory 120. Note that the data processing program 132 is provided in the form of being recorded on a recording medium such as a CD-ROM, a DVD-ROM, or a flash memory, or in the form of being downloaded via the network.

<2.3 Configuration of Management Server>

Figure 27:
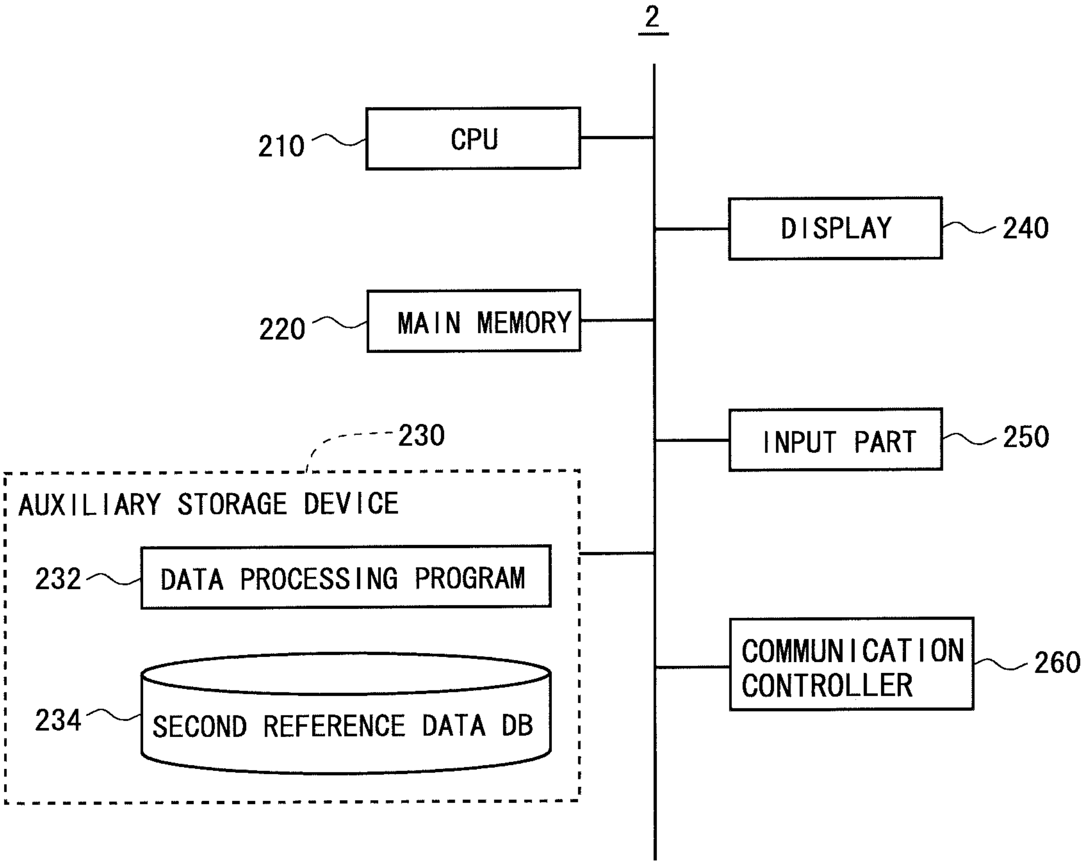
FIG. 27 is a block diagram showing a hardware configuration of a management server in the second embodiment.

Next, the configuration of the management server 2 will be described. FIG. 27 is a block diagram showing a hardware configuration of the management server 2. The management server 2 includes a CPU 210, a main memory 220, an auxiliary storage device 230, a display 240, an input part 250, and a communication controller 260. The CPU 210, the main memory 220, the auxiliary storage device 230, the display 240, the input part 250, and the communication controller 260 respectively have the same functions as the CPU 110, the main memory 120, the auxiliary storage device 130, the display 140, the input part 150, and the communication controller 160 in the controller 100 of the substrate processing apparatus 1. However, in the auxiliary storage device 230, a data processing program 232 that is different from the data processing program 132 stored in the auxiliary storage device 130 is stored. In addition, second reference data DB 234 is provided in the auxiliary storage device 230. As described above, in the auxiliary storage device 230 of the management server 2, the time series data DB is not provided, and only the second reference data DB 234 for holding the reference data necessary for the reference data extension processing is provided.

When the management server 2 is activated, the data processing program 232 is read into the main memory 220, and the CPU 210 executes the data processing program 232 read into the main memory 220. Note that the data processing program 232 is provided in the form of being recorded on a recording medium such as a CD-ROM, a DVD-ROM, a flash memory, or the like, or in the form of being downloaded via the network. A program in which the data processing program 132 for the substrate processing apparatus 1 and the data processing program 232 for the management server 2 are integrated may be provided, in the form of being recorded on a recording medium or in the form of being downloaded via the network, to the substrate processing apparatus 1 and the management server 2.

<2.4 Reference Data Extension Processing (Data Processing Concerning Extension of Reference Data)>

Figure 28:
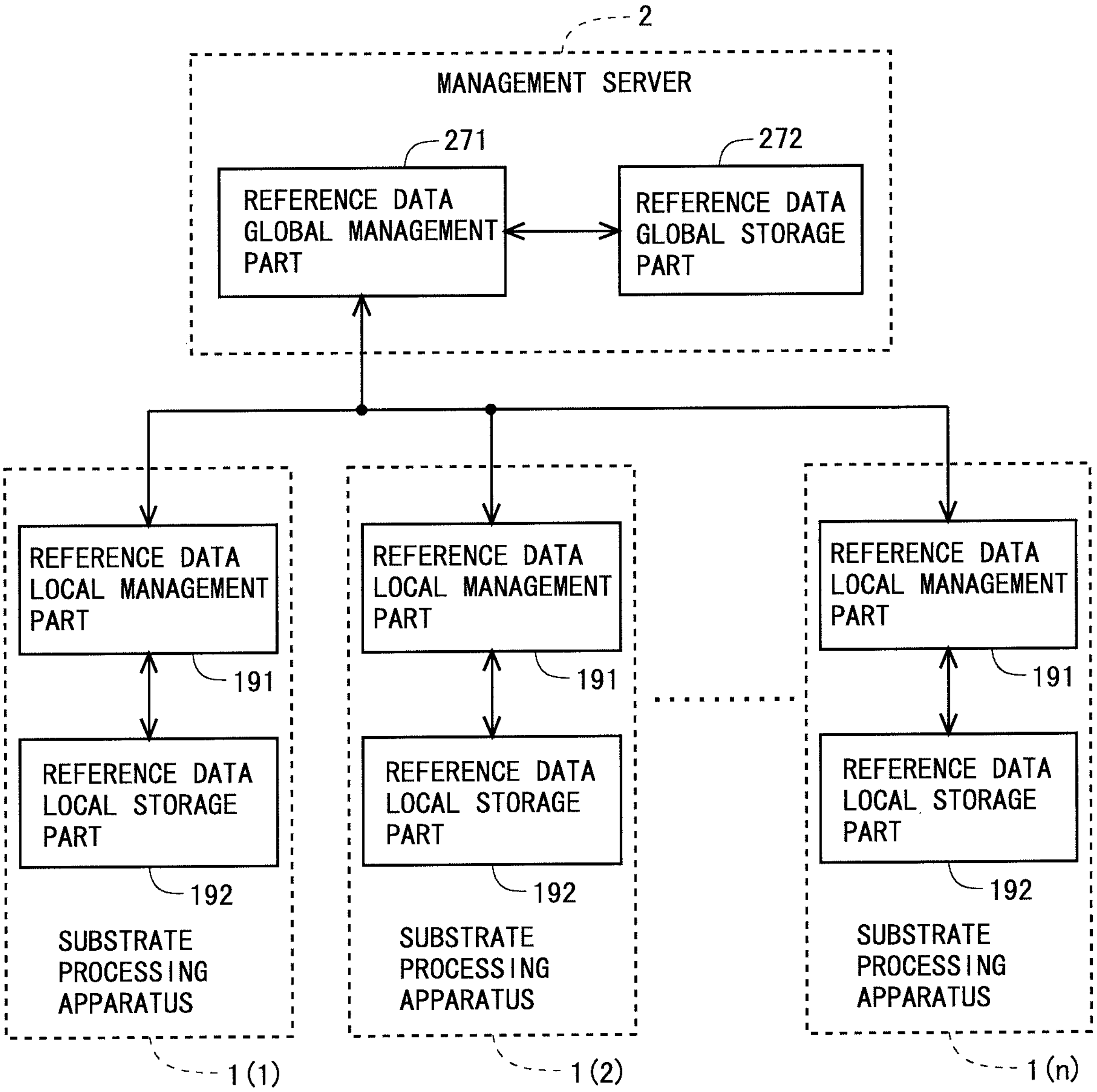
FIG. 28 is a functional block diagram showing a functional configuration relating to reference data extension processing in the second embodiment.

In the reference data extension processing in the present embodiment, the reference data for a certain substrate processing apparatus 1 is extended to the other substrate processing apparatuses 1. FIG. 28 is a functional block diagram showing a functional configuration relating to the reference data extension processing. Each substrate processing apparatus 1 is provided with a reference data local management part 191 and a reference data local storage part 192 as functional components relating to the reference data extension processing. In the management server 2, a reference data global management part 271 and a reference data global storage part 272 are provided as functional components relating to the reference data extension processing. Note that, in the present embodiment, an extension management part is achieved by the management server 2, and a reference data extension part is achieved by the reference data local management part 191 and the reference data global management part 271.

In the reference data local storage part 192, reference data for the corresponding substrate processing apparatus 1 is stored. The reference data local management part 191 uses the reference data local storage part 192 to manage the reference data for the corresponding substrate processing apparatus 1. The reference data global storage part 272 stores reference data used for reference data extension processing. The reference data global management part 271 uses the reference data global storage part 272 to manage the reference data used for the reference data extension processing. The reference data local storage part 192 is achieved by the first reference data DB 136 (see FIG. 25), and the reference data global storage part 272 is achieved by the second reference data DB 234 (see FIG. 27).

In the present embodiment, for each recipe, one substrate processing apparatus 1 is defined as "main" and the other substrate processing apparatuses 1 are defined as "sub." That is, in the present embodiment, each substrate processing apparatus 1 corresponds to a unit-element. Hereinafter, the substrate processing apparatus 1 defined as "main" will be referred to as a "main apparatus", and the substrate processing apparatus 1 defined as "subordinate" will be referred to as a "sub apparatus." The main apparatus corresponds to the main unit-element, and the sub apparatus corresponds to the sub unit-element. In the reference data extension processing, the reference data is extended from the main apparatus to the sub apparatus, but the reference data is not extended from the sub apparatus to the main apparatus. For example, when the main apparatus for a certain recipe is the substrate processing apparatus 1(1), the reference data for the recipe is extended from the substrate processing apparatus 1(1) to the substrate processing apparatuses 1(2) to 1(*n*).

The reference data extension processing is performed when the reference data is changed in the main apparatus. In other words, the reference data extension processing is performed with the change in the reference data in the main apparatus taken as a trigger. How the reference data is changed is similar to that in the first embodiment, and hence the description thereof will be omitted.

Figure 29:
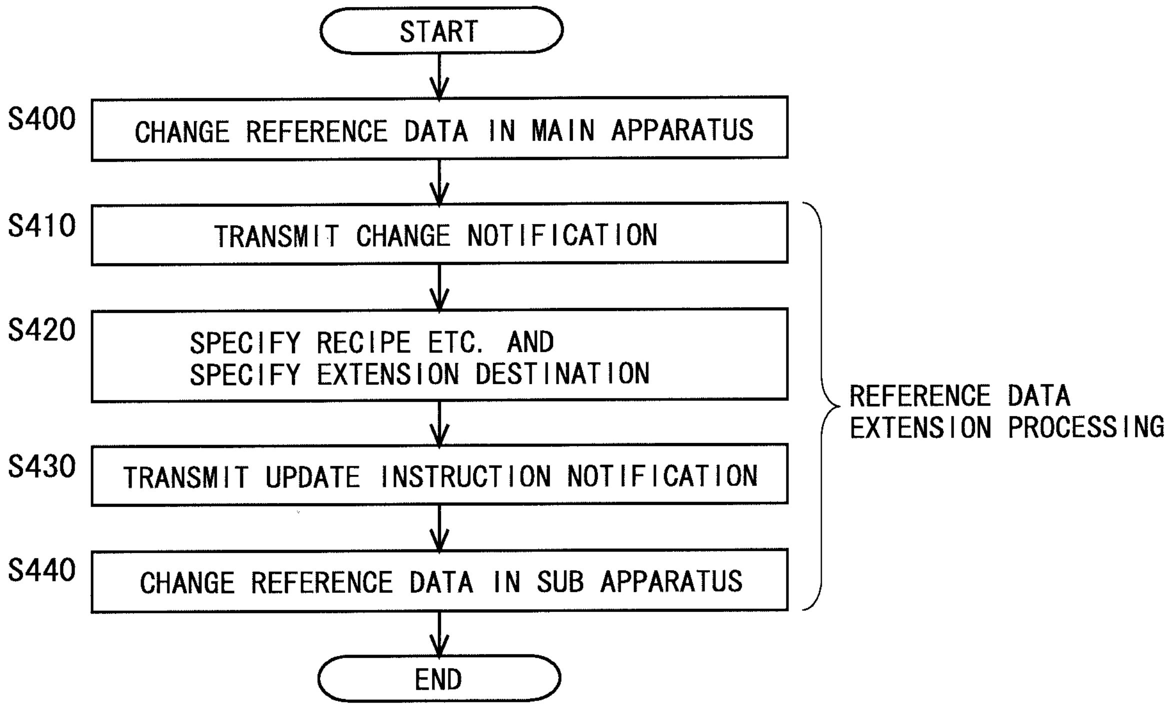
FIG. 29 is a flowchart showing a procedure of the reference data extension processing in the second embodiment.

Next, based on the contents described above, the procedure of the reference data extension processing will be described. FIG. 29 is a flowchart showing the procedure of the reference data extension processing in the present embodiment. A series of processing shown in FIG. 29 is achieved by the CPU 110 in the controller 100 executing the data processing program 132 in the substrate processing apparatus 1 and by the CPU 210 in the management server 2 executing the data processing program 232.

Figure 30:
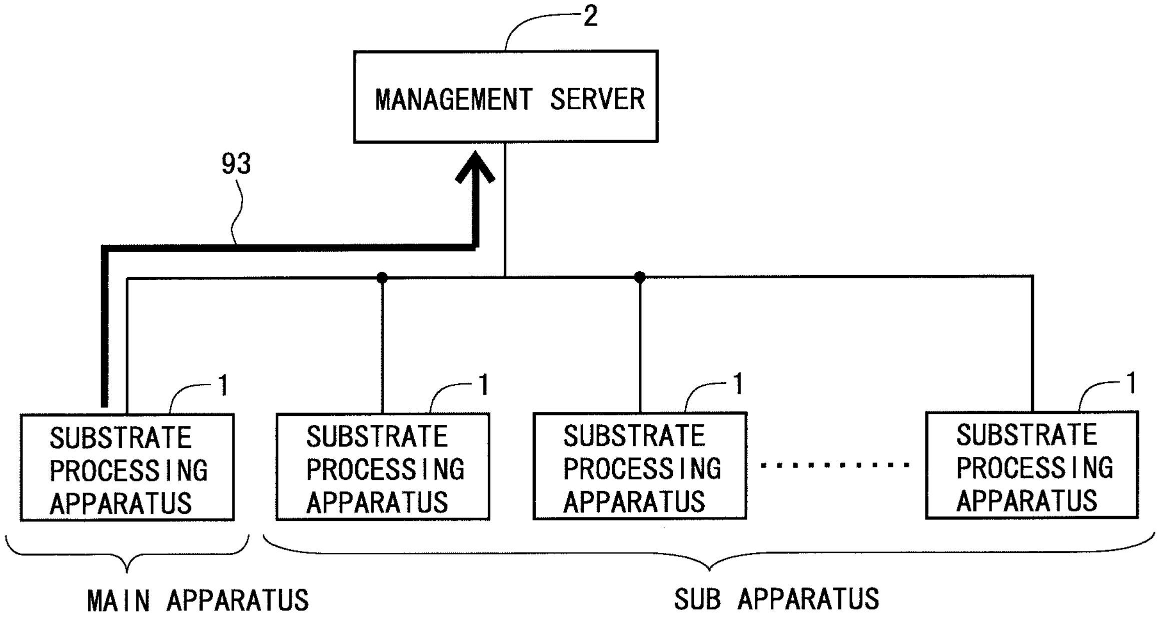
FIG. 30 is a diagram for explaining transmission of a change notification in the second embodiment.

First, in the main apparatus, a change in the reference data (an update of the reference data stored in the reference data local storage part 192) is made (step S400). With the change in the reference data in step S400 taken as a trigger, the reference data local management part 191 of the main apparatus transmits a change notification indicating the change in the reference data together with the reference data after change (new reference data) to the reference data global management part 271 in the management server 2 (step S410). In this manner, in step S410, as indicated by an arrow marked with reference numeral 93 in FIG. 30, the change notification is transmitted together with the new reference data from the main apparatus to the management server 2.

Next, the reference data global management part 271 in the management server 2 specifies the substrate processing apparatus 1 whose reference data has been changed (i.e., main apparatus) and a recipe whose reference data has been changed, based on the change notification and the new reference data transmitted in step S410 (step S420). Then, the reference data global management part 271 specifies the substrate processing apparatus 1 to be the extension destination of the new reference data (i.e., sub apparatus) by referring to the reference data global storage part 272. Further, the reference data global management part 271 changes (updates) the reference data for the target recipe among the reference data stored in the reference data global storage part 272 to the new reference data.

Figure 31:
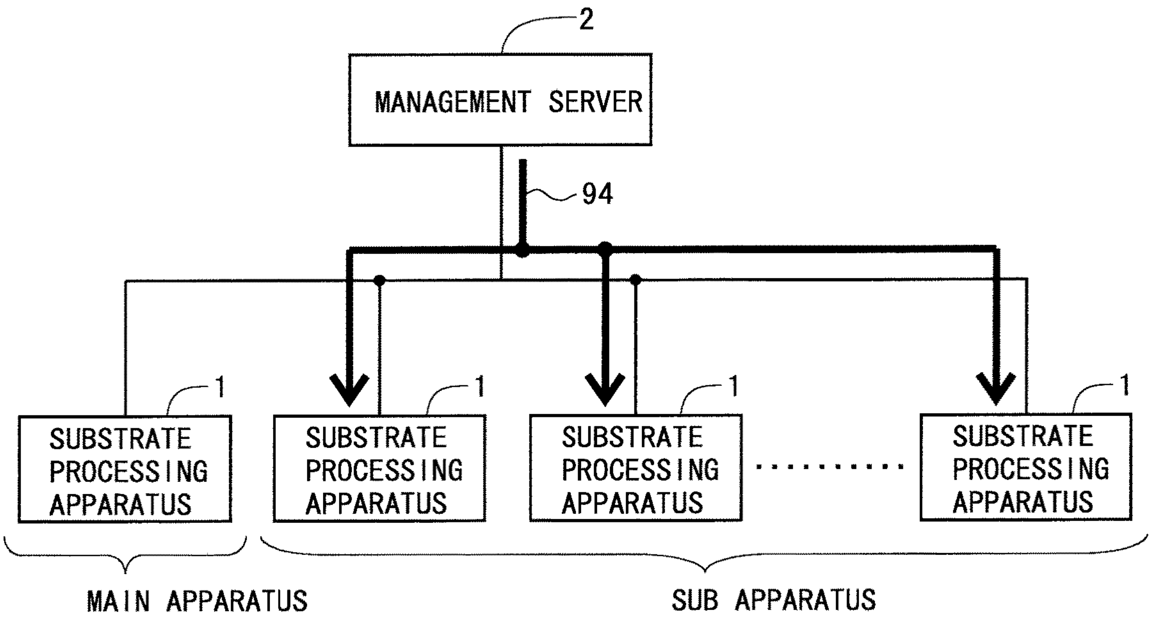
FIG. 31 is a diagram for explaining transmission of an update instruction notification in the second embodiment.

Next, the reference data global management part 271 in the management server 2 transmits an update instruction notification together with the new reference data to the sub apparatus specified in step S420 (i.e., the substrate processing apparatus 1 being the extension destination of the new reference data) (step S430). In this manner, in step S430, as indicated by an arrow marked with reference numeral 94 in FIG. 31, the update instruction notification is transmitted together with the new reference data from the management server 2 to the sub apparatus.

Thereafter, in each sub apparatus, the reference data local management part 191 changes (updates) the reference data for the target recipe among the reference data stored in the reference data local storage part 192 to the new reference data, based on the update instruction notification (step S440). This completes the reference data extension processing.

Note that, in the present embodiment, a reference data changing step is achieved by step S400, and a reference data extending step is achieved by steps S410 to S440. Further, a reference data uploading step is achieved by step S410, an extension destination specifying step is achieved by step S420, a reference data downloading step is achieved by step S430, and a reference data updating step is achieved by step S440.

Figure 32:
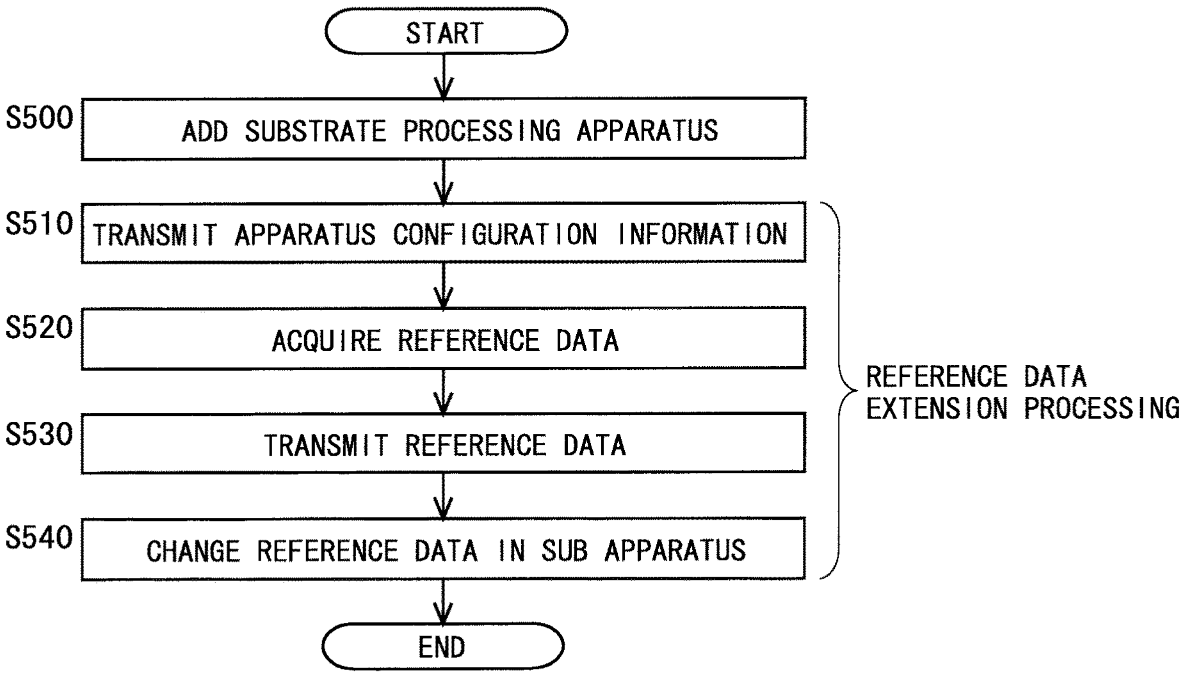
FIG. 32 is a flowchart showing a procedure of the reference data extension processing at the time when a substrate processing apparatus is added in the second embodiment.

Meanwhile, in the present embodiment, the reference data extension processing is performed also when a new substrate processing apparatus 1 is added to the substrate processing system. At this time, the added substrate processing apparatus 1 is defined as a sub apparatus concerning all the recipes, and for each recipe, the reference data is extended from the substrate processing apparatus 1 (main apparatus) defined as main to the added substrate processing apparatus 1. The procedure of the reference data extension processing at the time of addition of the substrate processing apparatus 1 will be described below with reference to the flowchart shown in FIG. 32. This processing is also achieved by the CPU 110 in the controller 100 executing the data processing program 132 in the substrate processing apparatus 1 and by the CPU 210 in the management server 2 executing the data processing program 232.

First, the substrate processing apparatus 1 is added to the substrate processing system (step S500). More specifically, one substrate processing apparatus (hereinafter referred to as "newly added apparatus") is additionally connected to the network 3 constituting the substrate processing system, and the power of the newly added apparatus is turned on. The newly added apparatus transmits apparatus configuration information (e.g., information such as a type of a chamber, a type of a chemical liquid to be used, a type of a nozzle that discharges a chemical liquid, etc.) for specifying the type of the apparatus to the reference data global management part 271 in the management server 2 (step S510). By transmitting the apparatus configuration information to the reference data global management part 271 in this manner, even when a plurality of types of substrate processing apparatuses 1 are mixed in the substrate processing system, appropriate reference data corresponding to the type of the newly added apparatus is extended to the newly added apparatus.

Next, the reference data global management part 271 acquires the latest reference data for each recipe from the reference data global storage part 272 based on the apparatus configuration information transmitted in step S510 (step S520). Then, the reference data global management part 271 transmits the reference data acquired in step S520 to the reference data local management part 191 of the newly added apparatus (step S530).

Thereafter, in the newly added apparatus, the reference data local management part 191 stores the reference data for each recipe transmitted in step S530 in the reference data local storage part 192 (step S540). This completes the reference data extension processing.

As described above, when the substrate processing apparatus 1 is added to this substrate processing system, as data to be compared (for detecting an abnormality of processing, etc.) with unit-processing data obtained by future processing in the newly added apparatus, the reference data already held in the substrate processing system is extended to the newly added apparatus.

Note that, in the present embodiment, a configuration information transmitting step is achieved by step S510, a reference data acquiring step is achieved by step S520, a reference data transmitting step is achieved by step S530, and a reference data storing step is achieved by step S540. In addition, a first reference data storage part is achieved by the reference data local storage part 192, and a second reference data storage part is achieved by the reference data global storage part 272.

<2.5 Effects>

According to the present embodiment, in the substrate processing system in which the reference data is defined for each substrate processing apparatus 1 for each recipe, when the reference data for a certain recipe is changed in the substrate processing apparatus 1 defined as the main apparatus concerning the target recipe, the reference data after change is extended to the substrate processing apparatus 1 defined as the sub apparatus concerning the target recipe. As a result, for example, also for the substrate processing apparatus 1 for which a favorable result concerning a certain recipe has not been obtained, it is possible to hold unit-processing data of a favorable result concerning the target recipe as reference data. In this manner, unit-processing data obtained by processing in each substrate processing apparatus 1 can be compared with suitable reference data, so that an abnormality of processing executed in each substrate processing apparatus 1 can be detected accurately. Further, when the substrate processing apparatus 1 is added to the substrate processing system, the apparatus configuration information for specifying the type of the apparatus is transmitted from the newly added apparatus to the management server 2, and the latest reference data based on the apparatus configuration information is extended from the management server 2 to the newly added apparatus. In this manner, also for the newly added apparatus, it is possible to hold unit-processing data of a favorable result concerning each recipe as reference data. As described above, according to the present embodiment, it is possible to perform the abnormality detection using time series data more accurately than before.

3. Modified Example

In each of the above embodiments, when the reference data is changed in the main unit or the main apparatus, the new reference data being the reference data after change is automatically extended to the sub unit or sub apparatus. However, the present invention is not limited thereto, and the reference data may be extended by the operator's operation (i.e., manually). Note that the function of manually extending the reference data as in the present modified example may be additionally provided in an apparatus/system in which the reference data is automatically extended as in the above embodiments.

Figure 33:
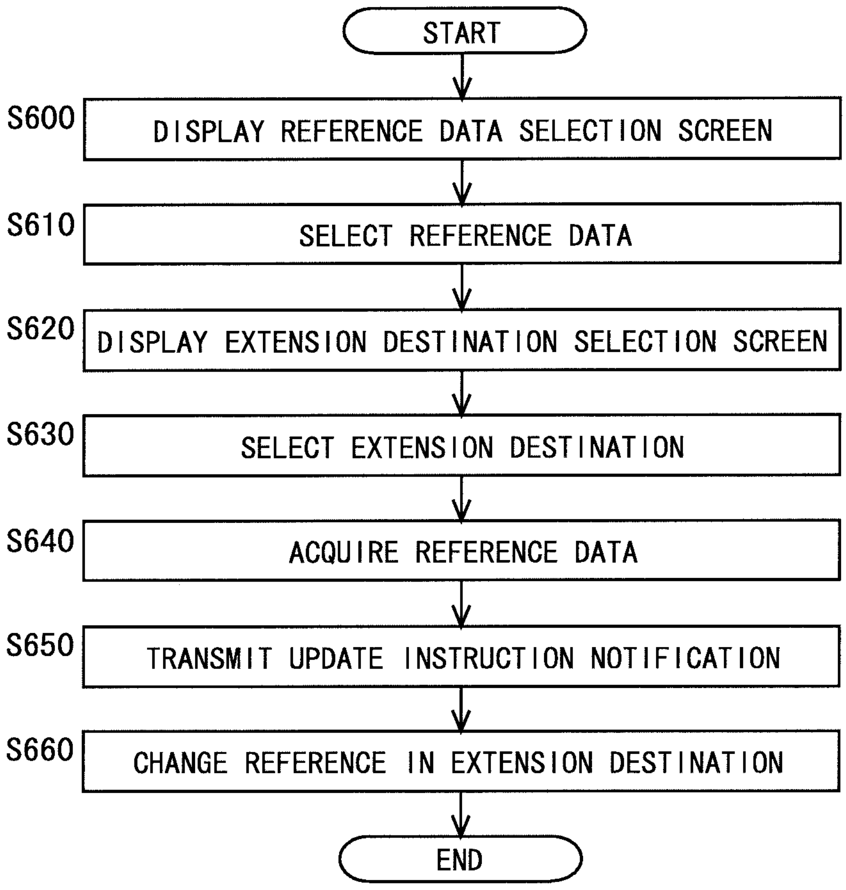
FIG. 33 is a flowchart showing a procedure of reference data extension processing in a modified example.

A procedure of the reference data extension processing in the present modified example will be described below with reference to the flowchart shown in FIG. 33. Note that, in the present modified example, as in the second embodiment, it is assumed that one substrate processing system (data processing system) is made up of one management server 2 and a plurality of substrate processing apparatuses 1. However, unlike the second embodiment, it is assumed that the reference data for each recipe is defined for each processing unit 22 in each substrate processing apparatus 1.

Figure 34:
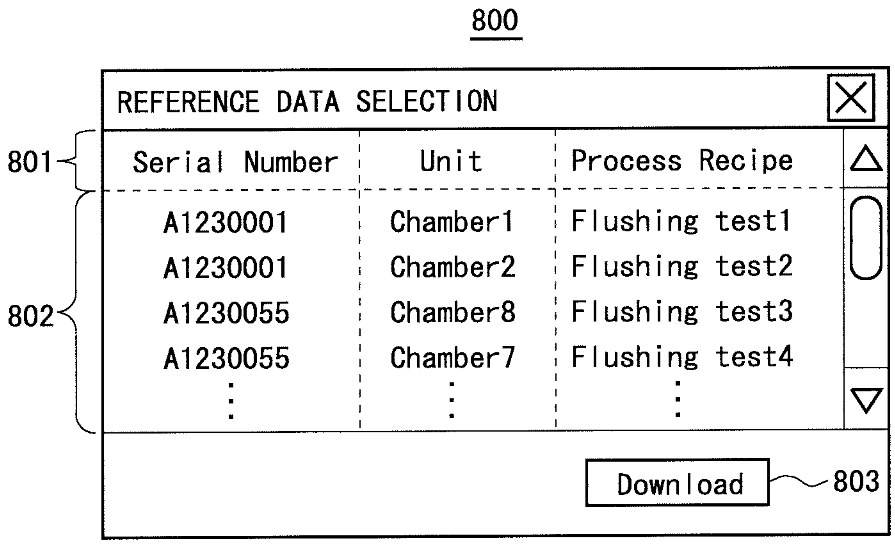
FIG. 34 is a view showing an example of a reference data selection screen in the modified example.

In the present modified example, first, based on a predetermined operation of the operator at the management server 2, a reference data selection screen 800 for selecting reference data to be extended, for example as shown in FIG. 34, is displayed on the display 240 in the management server (step S600). As shown in FIG. 34, the reference data selection screen 800 includes an item name display area 801, a reference data list area 802, and a Download button 803.

In the item name display area 801, the name of the item, which serves as a key for specifying the reference data and is displayed in the reference data list area 802, is displayed. "Serial Number" is an item name representing a serial number (manufacturing number) for uniquely specifying the substrate processing apparatus 1. "Unit" is an item name representing the processing unit 22. "Process Recipe" is an item name representing a name of a recipe.

In the reference data list area 802, a list of reference data (a list of items serving as keys for specifying reference data) stored in the reference data global storage part 272 (see FIG. 28) of the management server 2 is displayed. In the example shown in FIG. 34, it is grasped that data on the first row of the reference data list area 802 represents reference data for a recipe named "Flushing test 1", and the reference data is unit-processing data obtained by processing in the processing unit 22 named "Chamber1" of the substrate processing apparatus 1 with a serial number "A1230001." The operator can select one piece of reference data (one row) from the pieces of reference data displayed in the reference data list area 802.

The Download button 803 is a button for instructing the extension of the reference data selected in the reference data list area 802. Note that, when this download button 803 is pressed, an extension destination selection screen 810 (see FIG. 35) described later is displayed before extension of the reference data is actually started.

After displaying of the reference data selection screen 800, the operator selects the reference data to be extended from the reference data displayed in the reference data list area 802 (step S610). In this state, the operator presses the download button 803. As a result, an extension destination selection screen 810 for selecting an extension destination, for example, as shown in FIG. 35, is displayed on the display 240 of the management server 2 (step S620).

Figure 35:
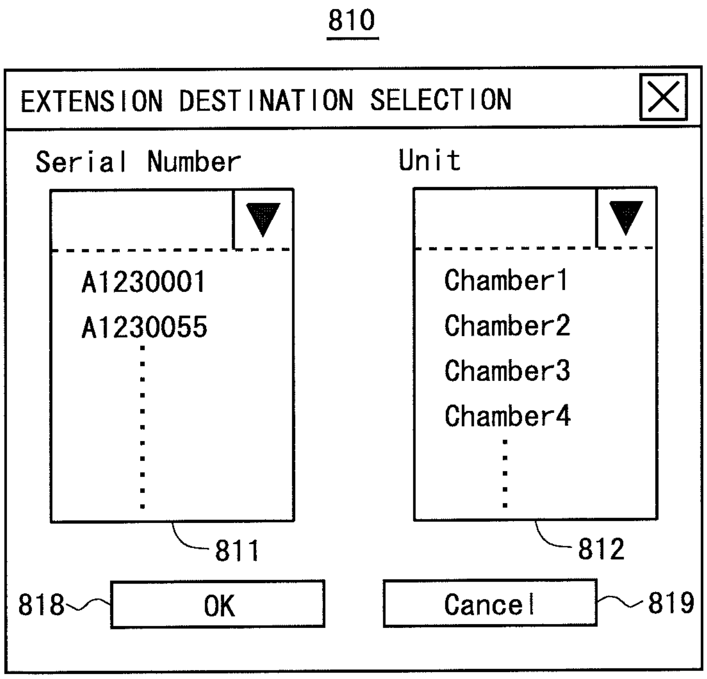
FIG. 35 is a view showing an example of an extension destination selection screen in the modified example.

As shown in FIG. 35, the extension destination selection screen 810 includes two list boxes 811, 812, an OK button 818, and a Cancel button 819. The list box 811 is an interface for selecting the substrate processing apparatus 1 to be an extension destination. The list box 812 is an interface for selecting the processing unit 22 to be an extension destination. Note that, in the list box 812, a list of the processing units 22 provided in the substrate processing apparatus 1 selected in the list box 811 is displayed. An OK button 818 is a button for instructing execution to extend the reference data to the selected extension destination. The Cancel button 819 is a button for canceling the extension of the reference data.

After displaying of the extension destination selection screen 810, the operator selects the substrate processing apparatus 1 to be the extension destination by the list box 811, and further selects the processing unit 22 to be the extension destination by the list box 812 (step S630). In this state, the operator presses the OK button 818. As a result, the reference data global management part 271 of the management server 2 acquires the reference data selected in step S610 from the reference data global storage part 272 (step S640). Then, the reference data global management part 271 transmits an update instruction notification together with the reference data acquired in step S640 to the extension destination selected in step S630 (step S650). Thereafter, the reference data for the target recipe is updated at the extension destination (step S660).

As described above, the extension of the reference data may be performed by the operator's operation (i.e., manually). Note that, in the present modified example, an extension destination designation part is achieved by the reference data selection screen 800 and the extension destination selection screen 810.

Although the present invention has been described in detail above, the above description is illustrative in all aspects and is not restrictive. It is understood that numerous other modifications and variations can be devised without departing from the scope of the present invention.

The present application claims priority to Japanese Patent Application No. 2018-20798 filed on Feb. 8, 2018 entitled "Data Processing Method, Data Processing Apparatus, Data Processing System, and Data Processing Program", and the entire contents of which are incorporated herein by reference.

What is claimed is:

1. A data processing method, the method comprising:

a reference data changing step of changing reference data which is data selected from a plurality of pieces of unit-processing data for each unit-element and is data to be compared with each piece of unit-processing data that is to be evaluated; and a reference data extending step of extending a new reference data which is the reference data after changed by the reference data changing step to a unit-element other than the unit-element for which the reference data has been changed in the reference data changing step, wherein the plurality of pieces of unit-processing data are a plurality of pieces of time series data obtained by unit-processing as unit-processing data, and the plurality of pieces of time series data are sensor data obtained from a sensor that measures a physical quantity showing an operation state of a substrate processing apparatus, wherein one unit-element is defined as a main unit-element, and a unit-element other than the main unit-element is defined as a sub unit-element, the reference data for the main unit-element is changed in the reference data changing step, and the new reference data is extended to the sub unit-element in the reference data extending step, and wherein the reference data extending step includes, a reference data uploading step of transmitting the new reference data from the main unit-element to an extension management part for managing extension of the reference data, and a reference data downloading step of transmitting the new reference data transmitted to the extension management part in the reference data uploading step from the extension management part to the sub unit-element.

2. A data processing apparatus, the apparatus comprising:

a sensor that obtains a plurality of pieces of unit-processing data, which are a plurality of pieces of time series data, by measuring a physical quantity showing an operation state of a substrate processing apparatus; and a controller that controls an object to be controlled and that accumulates and holds the plurality of pieces of unit-processing data obtained from the sensor, the object being included in the substrate processing apparatus, wherein the controller includes, a reference data storage that is provided for each unit-element and stores reference data which is data selected from a plurality of pieces of unit-processing data for each unit-element and is data to be compared with each piece of unit-processing data that is to be evaluated; and a reference data extension configured to extend the reference data, which is stored in the reference data storage for one unit-element, to the other unit-element, a reference data changing part configured to change the reference data stored in the reference data storage, and an extension management part configured to manage extension of the reference data by the reference data extension, wherein one unit-element is defined as a main unit-element, and a unit-element other than the main unit-element is defined as a sub unit-element, wherein the reference data changing part changes the reference data for the main unit-element, and wherein the reference data extension extends the changed reference data to the sub unit-element by transmitting the changed reference data from the main unit-element to the extension management part and transmitting the changed reference data, that is transmitted to the extension management part, from the extension management part to the sub unit-element.

3. A data processing system for processing a plurality of pieces of unit processing data, the system comprising:

a sensor that obtains a plurality of pieces of unit-processing data, which are a plurality of pieces of time series data, by measuring a physical quantity showing an operation state of a substrate processing apparatus; and a management server connected to the substrate processing apparatus via a network, wherein the management server includes, a reference data storage that is provided for each unit-element and stores reference data which is data selected from a plurality of pieces of unit-processing data for each unit-element and is data to be compared with each piece of unit-processing data that is to be evaluated; and a reference data extension configured to extend the reference data, which is stored in the reference data storage for one unit-element, to the other unit-element, a reference data changing part configured to change the reference data stored in the reference data storage, and an extension management part configured to manage extension of the reference data by the reference data extension, wherein one unit-element is defined as a main unit-element, and a unit-element other than the main unit-element is defined as a sub unit-element, wherein the reference data changing part changes the reference data for the main unit-element, and wherein the reference data extension extends the changed reference data to the sub unit-element by transmitting the changed reference data from the main unit-element to the extension management part and transmitting the changed reference data, that is transmitted to the extension management part, from the extension management part to the sub unit-element.

4. The data processing system according to claim 3, wherein, when the reference data is changed by the reference data changing part, the reference data extension automatically extends the changed reference data, to a unit-element other than the unit-element for which the reference data has been changed.

5. The data processing system according to claim 3 further comprising an extension designation part for designating changed reference data to be extended and a unit-element to be an extension destination, wherein the reference data extension extends the changed reference data designated by the extension designation part to the unit-element designated by the extension designation part.

6. A non-transitory computer-readable recording medium having recorded therein a data processing program, wherein the data processing program causes a computer to execute:

a reference data changing step of changing reference data which is data selected from a plurality of pieces of unit-processing data for each unit-element and is data to be compared with each piece of unit-processing data that is to be evaluated; and a reference data extending step of extending new reference data which is the reference data after change by the reference data changing step to a unit-element other than the unit-element for which the reference data has been changed in the reference data changing step, wherein the plurality of pieces of unit-processing data are a plurality of pieces of time series data obtained by unit-processing as unit-processing data, and the plurality of pieces of time series data are sensor data obtained from a sensor that measures a physical quantity showing an operation state of a substrate processing apparatus, wherein one unit-element is defined as a main unit-element, and a unit-element other than the main unit-element is defined as a sub unit-element, the reference data for the main unit-element is changed in the reference data changing step, and the new reference data is extended to the sub unit-element in the reference data extending step, and wherein the reference data extending step includes, a reference data uploading step of transmitting the new reference data from the main unit-element to an extension management part for managing extension of the reference data, and a reference data downloading step of transmitting the new reference data transmitted to the extension management part in the reference data uploading step from the extension management part to the sub unit-element.

7. A data processing method, the method comprising:

a reference data changing step of changing reference data which is data selected from a plurality of pieces of unit-processing data for each unit-element and is data to be compared with each piece of unit-processing data that is to be evaluated; and a reference data extending step of extending a new reference data which is the reference data after changed by the reference data changing step to a unit-element other than the unit-element for which the reference data has been changed in the reference data changing step, wherein the plurality of pieces of unit-processing data are a plurality of pieces of time series data obtained by unit-processing as unit-processing data, and the plurality of pieces of time series data are sensor data obtained from a sensor that measures a physical quantity showing an operation state of a substrate processing apparatus, wherein one unit-element is defined as a main unit-element, and a unit-element other than the main unit-element is defined as a sub unit-element, the reference data for the main unit-element is changed in the reference data changing step, and the new reference data is extended to the sub unit-element in the reference data extending step, wherein the unit-processing is processing executed as one recipe for one substrate in a substrate processing apparatus, and definition as the main unit-element and the sub unit-element is made for each recipe, and wherein the reference data extending step includes, a reference data uploading step of transmitting the new reference data and a change notification indicating a change in the reference data from the main unit-element to an extension management part for managing extension of the reference data, an extension destination specifying step of specifying a recipe for which the reference data has been changed based on the new reference data and the change notification and specifying a unit-element, defined as a sub unit-element with respect to the specified recipe, as an extension destination of the new reference data, in the extension management part, a reference data downloading step of transmitting, from the extension management part to the unit-element specified as the extension destination in the extension destination specifying step, the new reference data transmitted to the extension management part in the reference data uploading step and an update instruction notification for instructing update of the reference data, and a reference data updating step of updating the reference data for the recipe specified in the extension destination specifying step to the new reference data based on the update instruction notification in the sub unit-element.

8. A data processing apparatus, the apparatus comprising:

a sensor that obtains a plurality of pieces of unit-processing data, which are a plurality of pieces of time series data, by measuring a physical quantity showing an operation state of a substrate processing apparatus; and a controller that controls an object to be controlled and that accumulates and holds the plurality of pieces of unit-processing data obtained from the sensor, the object being included in the substrate processing apparatus, wherein the controller includes, a reference data storage that is provided for each unit-element and stores reference data which is data selected from a plurality of pieces of unit-processing data for each unit-element and is data to be compared with each piece of unit-processing data that is to be evaluated; and a reference data extension configured to extend the reference data, which is stored in the reference data storage for one unit-element, to the other unit-element, a reference data changing part configured to change the reference data stored in the reference data storage, and an extension management part configured to manage extension of the reference data by the reference data extension, wherein one unit-element is defined as a main unit-element, and a unit-element other than the main unit-element is defined as a sub unit-element, wherein unit-processing is processing executed as one recipe for one substrate in the substrate processing apparatus, and definition as the main unit-element and the sub unit-element is made for each recipe, wherein the reference data changing part changes the reference data for the main unit-element, and wherein the reference data extension extends the changed reference data to the sub unit-element by, transmitting the changed reference data and a change notification indicating a change in the reference data from the main unit-element to the extension management part, specifying a recipe for which the reference data has been changed based on the changed reference data and the change notification and specifying a unit-element, defined as a sub unit-element with respect to the specified recipe, as an extension destination of the changed reference data, in the extension management part, transmitting, from the extension management part to the unit-element specified as the extension destination, the changed reference data transmitted to the extension management part and an update instruction notification for instructing update of the reference data, and updating the reference data for the recipe specified in the extension management part to the changed reference data based on the update instruction notification in the sub unit-element.

9. A data processing system, the system comprising:

a sensor that obtains a plurality of pieces of unit-processing data, which are a plurality of pieces of time series data, by measuring a physical quantity showing an operation state of a substrate processing apparatus; and a management server connected to the substrate processing apparatus via a network, wherein the management server includes, a reference data storage that is provided for each unit-element and stores reference data which is data selected from a plurality of pieces of unit-processing data for each unit-element and is data to be compared with each piece of unit-processing data that is to be evaluated; and a reference data extension configured to extend the reference data, which is stored in the reference data storage for one unit-element, to the other unit-element, a reference data changing part configured to change the reference data stored in the reference data storage, and an extension management part configured to manage extension of the reference data by the reference data extension, wherein one unit-element is defined as a main unit-element, and a unit-element other than the main unit-element is defined as a sub unit-element, wherein unit-processing is processing executed as one recipe for one substrate in the substrate processing apparatus, and definition as the main unit-element and the sub unit-element is made for each recipe, wherein the reference data changing part changes the reference data for the main unit-element, and wherein the reference data extension extends the changed reference data to the sub unit-element by, transmitting the changed reference data and a change notification indicating a change in the reference data from the main unit-element to the extension management part, specifying a recipe for which the reference data has been changed based on the changed reference data and the change notification and specifying a unit-element, defined as a sub unit-element with respect to the specified recipe, as an extension destination of the changed reference data, in the extension management part, transmitting, from the extension management part to the unit-element specified as the extension destination, the changed reference data transmitted to the extension management part and an update instruction notification for instructing update of the reference data, and updating the reference data for the recipe specified in the extension management part to the changed reference data based on the update instruction notification in the sub unit-element.

10. The data processing system according to claim 9, wherein when the reference data is changed by the reference data changing part, the reference data extension automatically extends the changed reference data to a unit-element other than the unit-element for which the reference data has been changed.

11. The data processing system according to claim 9, further comprising an extension designation part for designating reference data to be extended and a unit-element to be an extension destination, wherein the reference data extension extends the reference data designated by the extension designation part to the unit-element designated by the extension designation part.

12. A non-transitory computer-readable recording medium having recorded therein a data processing program, wherein the data processing program causes a computer to execute:

a reference data changing step of changing reference data which is data selected from a plurality of pieces of unit-processing data for each unit-element and is data to be compared with each piece of unit-processing data that is to be evaluated; and a reference data extending step of extending new reference data which is the reference data after change by the reference data changing step to a unit-element other than the unit-element for which the reference data has been changed in the reference data changing step, wherein the plurality of pieces of unit-processing data are a plurality of pieces of time series data obtained by unit-processing as unit-processing data, and the plurality of pieces of time series data are sensor data obtained from a sensor that measures a physical quantity showing an operation state of a substrate processing apparatus, wherein one unit-element is defined as a main unit-element, and a unit-element other than the main unit-element is defined as a sub unit-element, the reference data for the main unit-element is changed in the reference data changing step, and the new reference data is extended to the sub unit-element in the reference data extending step, wherein the unit-processing is processing executed as one recipe for one substrate in a substrate processing apparatus, and definition as the main unit-element and the sub unit-element is made for each recipe, and wherein the reference data extending step includes, a reference data uploading step of transmitting the new reference data and a change notification indicating a change in the reference data from the main unit-element to an extension management part for managing extension of the reference data, an extension destination specifying step of specifying a recipe for which the reference data has been changed based on the new reference data and the change notification and specifying a unit-element, defined as a sub unit-element with respect to the specified recipe, as an extension destination of the new reference data, in the extension management part, a reference data downloading step of transmitting, from the extension management part to the unit-element specified as the extension destination in the extension destination specifying step, the new reference data transmitted to the extension management part in the reference data uploading step and an update instruction notification for instructing update of the reference data, and a reference data updating step of updating the reference data for the recipe specified in the extension destination specifying step to the new reference data based on the update instruction notification in the sub unit-element.

* * * * *